(12) United States Patent
Kim et al.

(10) Patent No.: US 8,987,709 B2
(45) Date of Patent: Mar. 24, 2015

(54) ARYLENE CONTAINING POLYMER AND ORGANIC LIGHT-EMITTING DEVICE INCLUDING THE SAME

(75) Inventors: Hee-Yeon Kim, Yongin (KR); Seung-Gak Yang, Yongin (KR); Jae-Yong Lee, Yongin (KR); Jeoung-In Yi, Yongin (KR); Yoon-Hyun Kwak, Yongin (KR); Jong-Hyuk Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 12/895,374

(22) Filed: Sep. 30, 2010

(65) Prior Publication Data

US 2011/0084254 A1  Apr. 14, 2011

(30) Foreign Application Priority Data

Oct. 9, 2009  (KR) .................. 10-2009-0096394

(51) Int. Cl.
*H01L 29/08* (2006.01)
*C08G 61/12* (2006.01)
(Continued)

(52) U.S. Cl.
CPC .............. *C08G 61/122* (2013.01); *C08G 73/06* (2013.01); *C08G 73/0688* (2013.01);
(Continued)

(58) Field of Classification Search
CPC .................................. H01L 51/54; C08G 65/00
USPC .............. 257/40, E51.027; 313/504; 528/403
See application file for complete search history.

(56) References Cited

U.S. PATENT DOCUMENTS 6,249,369 B1 *  6/2001  Theiste et al. ................ 359/265
7,524,567 B2 *  4/2009  Park et al. ..................... 428/690
(Continued)

FOREIGN PATENT DOCUMENTS

CN  1483783 A  3/2004
DE  101 43 249 A1  3/2003
(Continued)

OTHER PUBLICATIONS

C.S. Krämer, K. Zeitler and T.J.J. Müller, First synthesis and electronic properties of (hetero) aryl bridged and directly linked redox active phenothiazinyl dyads and triads, Tetrahedron Letters, 2001, 8619-8624, vol. 42.

(Continued)

*Primary Examiner* — Caleb Henry
(74) *Attorney, Agent, or Firm* — Knobbe Martens Olson & Bear LLP

(57) ABSTRACT

A polymer and an organic light-emitting device including the polymer. An example of the polymer is

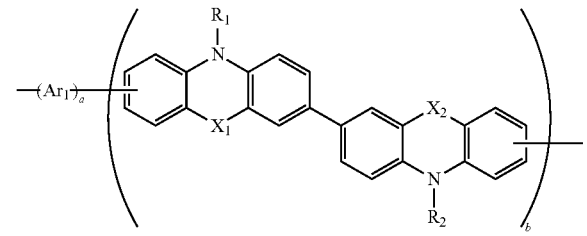

wherein in Formula 1, $Ar_1$ is each independently represented by $-(Q_1)_n-$, and $Q_1$ is selected from the group consisting of a substituted or unsubstituted $C_5$-$C_{30}$ arylene group, a substituted or unsubstituted $C_4$-$C_{30}$ heteroarylene group, a substituted or unsubstituted $C_2$-$C_{30}$ alkenylene group, and a group represented by $-N(Z_1)-$, and n is an integer from 1 to 10, and n groups of $Q_1$ in $-(Q_1)_n-$ is identical to or different from each other, and $X_1$ and $X_2$ are each independently selected from the group consisting of $-O-$, $-S-$, $-N(Z_2)-$, and $-C(Z_3)(Z_4)-$.

21 Claims, 1 Drawing Sheet

(51) Int. Cl.
*C08G 73/06* (2006.01)
*H01L 51/00* (2006.01)
*H01L 51/50* (2006.01)

(52) U.S. Cl.
CPC ....... *C08G 73/0694* (2013.01); *H01L 51/0035* (2013.01); *H01L 51/0039* (2013.01); *H01L 51/0043* (2013.01); *C08G 2261/344* (2013.01); *C08G 2261/512* (2013.01); *H01L 51/0037* (2013.01); *H01L 51/0055* (2013.01); *H01L 51/0081* (2013.01); *H01L 51/5048* (2013.01)
USPC ....... 257/40; 257/E51.027; 313/504; 528/403

(56) References Cited

U.S. PATENT DOCUMENTS

| | | |
|---|---|---|
| 7,648,777 B2 | 1/2010 | Park et al. |
| 2004/0072989 A1* | 4/2004 | Son et al. ............ 528/397 |
| 2006/0166038 A1* | 7/2006 | Park et al. ............ 428/690 |
| 2007/0176541 A1* | 8/2007 | Son et al. ............ 313/504 |
| 2009/0256475 A1* | 10/2009 | Nakatani et al. ......... 313/504 |

FOREIGN PATENT DOCUMENTS

| | | |
|---|---|---|
| JP | 2006233187 A | 9/2006 |
| JP | 2008-95080 | 4/2008 |
| KR | 10-2003-0097358 A | 12/2003 |
| KR | 10-2004-0044536 A | 5/2004 |
| KR | 10-2005-0077367 A | 8/2005 |
| KR | 10-2006-0085297 | 7/2006 |
| KR | 10-2006-0085297 A | 7/2006 |
| KR | 10-2007-0078200 A | 7/2007 |
| KR | 10-2007-0116441 A | 12/2007 |
| KR | 10-2009-0053949 A | 5/2009 |

OTHER PUBLICATIONS

Mi Seon Jung, Woong Shin, Sang Jun Park, Hyeri You, Jung Bae Park, Hongsuk Suh, Youngee Lim, Do Yeung Yoo and Joo Hyun Kim, Synthesis and characterization of thermally cross-linkable hole injection polymer based on poly(10-alkylphenothiazine) for polymer light-emitting diode, Journal, Synthetic Metals, 2009, 1928-1933, vol. 159, www.elseviar.com/locate/synmet.

Hye-Seon Yoon, Woo-Hyung Lee, Ji-Hoon Lee, Dong-Gun Lim, Do-Noon Hwang, and In-Nam Kang, Solution-Processable Field-Effect Transistors Fabricated Using Aryl Phenoxazine Based Polymers as the Active Layer, Article, 2009, 2371-2376, vol. 30, No. 10, Bull. Korean Chem. Soc.

Extended European Search Report issued by the European Patent Office dated Jan. 4, 2012, 7 pages.

Official Action issued by the Korean Industrial Property Office dated Aug. 12, 2011 in Korean Patent Application No. 10-2009-0096394, 3 pages.

Chinese Office Action dated Jan. 6, 2014, issued in connection with corresponding Chinese Patent Application No. 201010503410.X.

\* cited by examiner

| SECOND ELECTRODE |
|---|
| ELECTRON INJECTION LAYER |
| ELECTRON TRANSPORTING LAYER |
| EMISSIVE LAYER |
| FIRST LAYER |
| CONDUCTIVE BUFFER LAYER |
| FIRST ELECTRODE |
| SUBSTRATE |

ARYLENE CONTAINING POLYMER AND ORGANIC LIGHT-EMITTING DEVICE INCLUDING THE SAME

CROSS-REFERENCE TO RELATED APPLICATIONS

This application claims the benefit of Korean Patent Application No. 10-2009-0096394, filed on Oct. 9, 2009, in the Korean Intellectual Property Office, the disclosure of which is incorporated herein in its entirety by reference.

BACKGROUND

1. Field

The present embodiments relate to a polymer and an organic light-emitting device including the polymer.

2. Description of the Related Technology

Organic light-emitting self emissive devices include a pair of electrodes and an organic layer interposed between the electrodes, and when a current is supplied to the electrodes, electrons and holes injected through the electrodes are combined in the organic layer, thereby emitting light. Organic light-emitting devices are lightweight, and can be easily manufactured using a relatively small number of components. In addition, organic light-emitting devices provide high-quality images and have wide viewing angles. Furthermore, organic light-emitting devices provide high color purity, accurately realize mobile images, have low power consumption, and can be operated at low voltage. Due to these characteristics, organic light-emitting devices are suitable for mobile electronic devices.

A typical OLED has a structure including a substrate, an anode disposed on the substrate, and a hole transporting layer (HTL), an emissive layer (EML), an electron transporting layer (ETL), and a cathode which are sequentially stacked on the anode.

When a current is applied to the anode and the cathode, holes injected from the anode move to the EML via the HTL, and electrons injected from the cathode move to the EML via the ETL. The holes and electrons recombine in the EML to generate excitons. The excitons are radiatively decayed, thereby emitting light having a wavelength corresponding to a band gap of a corresponding material.

SUMMARY OF CERTAIN INVENTIVE ASPECTS

The present embodiments provide a polymer for manufacturing an organic light-emitting device (OLED) having a high efficiency and a long lifetime.

The present embodiments also provide an OLED including the polymer.

According to an aspect of the present embodiments, there is provided a polymer represented by Formula 1 below:

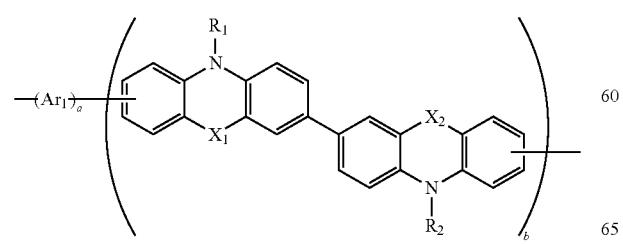

<Formula 1> wherein in Formula 1, $Ar_1$ is each independently represented by $-(Q_1)_n-$, and $Q_1$ is selected from the group consisting of a substituted or unsubstituted $C_5$-$C_{30}$ arylene group, a substituted or unsubstituted $C_4$-$C_{30}$ heteroarylene group, a substituted or unsubstituted $C_2$-$C_{30}$ alkenylene group, and a group represented by $-N(Z_1)-$, and n is an integer from 1 to 10, and n groups of $Q_1$ in $-(Q_1)_n-$ is identical to or different from each other, and $X_1$ and $X_2$ are each independently selected from the group consisting of $-O-$, $-S-$, $-N(Z_2)-$, and $-C(Z_3)(Z_4)-$, and $R_1$, $R_2$, $Z_1$, $Z_2$, $Z_3$, and $Z_4$ are each independently selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group, and a and b is independently a number in a range of 0.01 to 0.99, wherein a+b=1.

According to another aspect of the present embodiments, there is provided an organic light emitting device (OLED) comprising: a substrate; a first electrode; a second electrode; and a first layer comprising the polymer described above and disposed between the first and second electrodes.

BRIEF DESCRIPTION OF THE DRAWINGS

The above and other features and advantages of the present embodiments will become more apparent by describing in detail exemplary embodiments thereof with reference to the attached drawing in which:

FIG. 1 is a cross-sectional view illustrating an organic light-emitting device (OLED) according to an embodiment.

DETAILED DESCRIPTION OF CERTAIN INVENTIVE EMBODIMENTS

A polymer represented by Formula 1 below is provided:

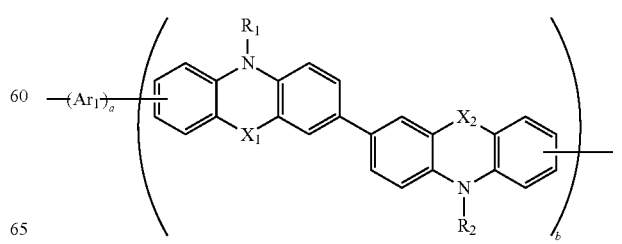

<Formula 1>

In Formula 1, $Ar_1$ may be each independently represented by $-(Q_1)_n-$.

$Q_1$ may be selected from the group consisting of a substituted or unsubstituted $C_5$-$C_{30}$ arylene group, a substituted or unsubstituted $C_4$-$C_{30}$ heteroarylene group, a substituted or unsubstituted $C_2$-$C_{30}$ alkenylene group, and a group represented by $—N(Z_1)—$. $Z_1$ may be selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group.

For example, $Q_1$ may be selected from the group consisting of a substituted or unsubstituted $C_5$-$C_{14}$ arylene group, a substituted or unsubstituted $C_4$-$C_{14}$ heteroarylene group, a substituted or unsubstituted $C_2$-$C_{10}$ alkenylene group, and a group represented by $—N(Z_1)—$, but is not limited thereto. $Z_1$ may be selected from the group consisting of hydrogen, a $C_1$-$C_{10}$ alkyl group, a $C_1$-$C_{10}$ alkoxy group, a $C_5$-$C_{14}$ aryl group, and a $C_4$-$C_{14}$ heteroaryl group. For example, $Z_1$ may be selected from the group consisting of hydrogen, a $C_1$-$C_{10}$ alkyl group, a $C_1$-$C_{10}$ alkoxy group, a phenyl group, and a naphthyl group, but is not limited thereto.

In some embodiments, $Q_1$ may be selected from the group consisting of a $C_2$-$C_{10}$ alkenylene group and functional groups represented by Formulae 2a through 2x below, but is not limited thereto:

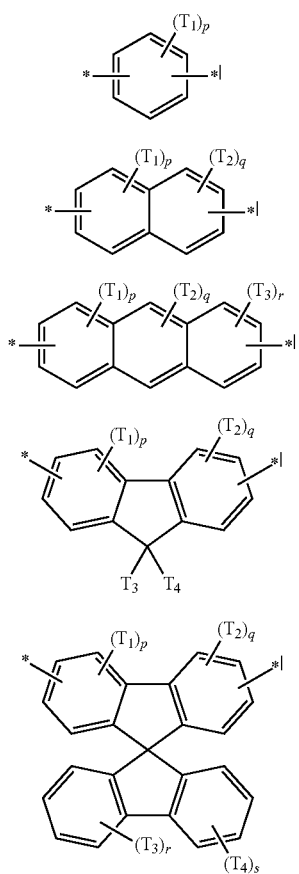

Formula 2a

Formula 2b

Formula 2c

Formula 2d

Formula 2e

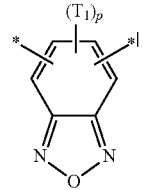

Formula 2f

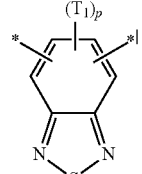

Formula 2g

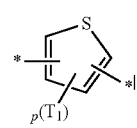

Formula 2h

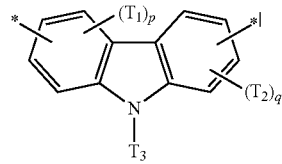

Formula 2i

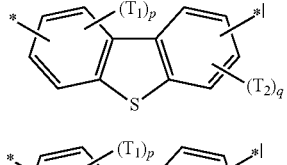

Formula 2j

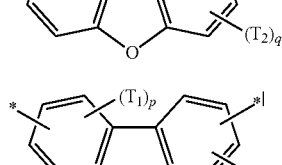

Formula 2k

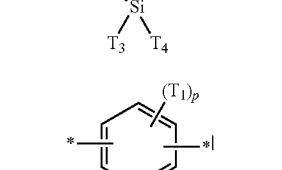

Formula 2l

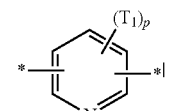

Formula 2m

In Formulae 2a through 2x, $T_1$ through $T_4$ may each independently be selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, a $C_4$-$C_{14}$ heteroaryl group, and a group represented by $—N(Z_5)(Z_6)$, and p, q, r, and s are each independently an integer from 0 through 4. $Z_5$ and $Z_6$ may be each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, and a $C_4$-$C_{14}$ heteroaryl group.

For example, in Formulae 2a through 2x, $T_1$ through $T_4$ may be each independently selected from the group consisting of hydrogen, a $C_1$-$C_{10}$ alkyl group, a $C_1$-$C_{10}$ alkoxy group, a phenyl group, a naphthyl group, and a group represented by —N($Z_5$)($Z_6$), and $Z_5$ and $Z_6$ may be each independently selected from the group consisting of hydrogen, a $C_1$-$C_{10}$ alkyl group, a $C_1$-$C_{10}$ alkoxy group, a phenyl group, and a naphthyl group, but are not limited thereto.

For example, p, q, r, and s may be each independently 0, 1, or 2, but are not limited thereto.

In Formulae 2a through 2x, groups of $T_1$ in -($T_1$)$_p$ may be identical to or different from each other, groups of $T_2$ in -($T_2$)$_q$ may be identical to or different from each other, groups of $T_3$ in -($T_3$)$_r$ may be identical to or different from each other, and groups of $T_4$ in -($T_4$)$_s$ may be identical to or different from each other. For example, when p is 2, the two groups of $T_1$ may be both methyl groups, or one of the two may be a methyl group and the other may be a phenyl group.

n may be an integer from 1 to 10. For example, n may be 1, 2, 3, 4, 5, 6, 7, 8, 9 or 10 but is not limited thereto.

Groups of $Q_1$ in -($Q_1$)$_n$- may be identical to or different from each other. For example, when n is 2, the two groups of $Q_1$ may be both phenylene groups, or one of the two may be a phenylene group and the other may be an ethenylene group.

In Formula 1, $Ar_1$ may be each independently of the groups represented by Formulae 2a through 2x and Formulae 3a through 3l below, but are not limited thereto:

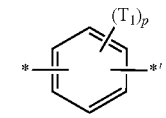

Formula 2a

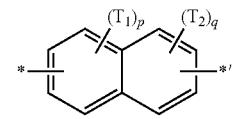

Formula 2b

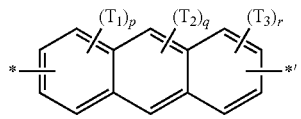

Formula 2c

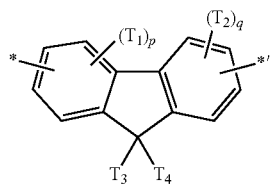

Formula 2d

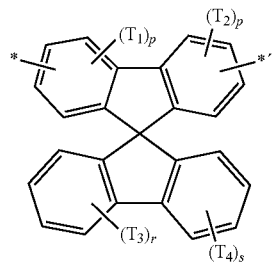

Formula 2e

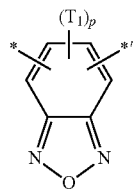

Formula 2f

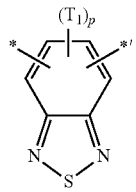

Formula 2g

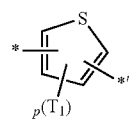

Formula 2h

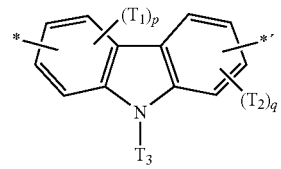

Formula 2i

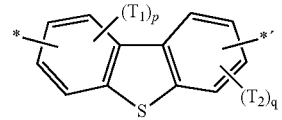

Formula 2j

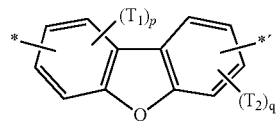

Formula 2k

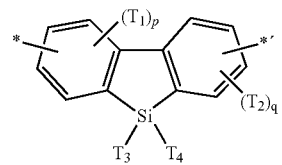

Formula 2l

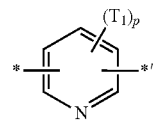

Formula 2m

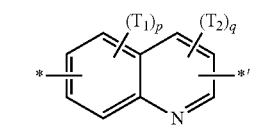

Formula 2n

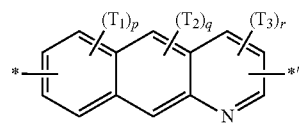

Formula 2o

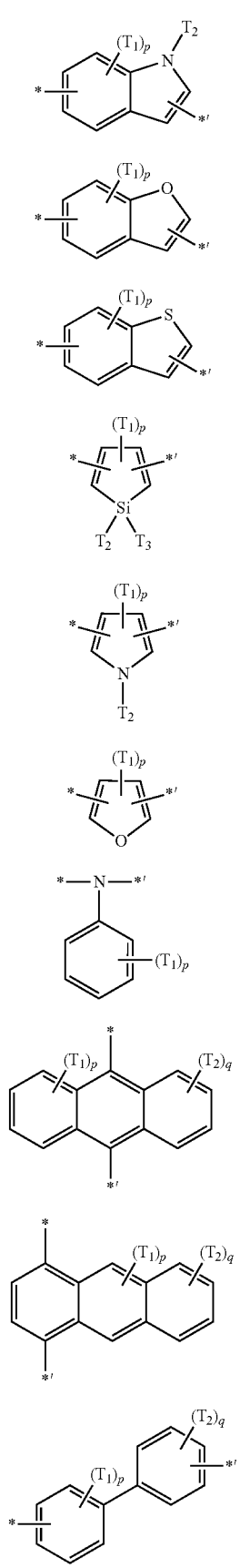

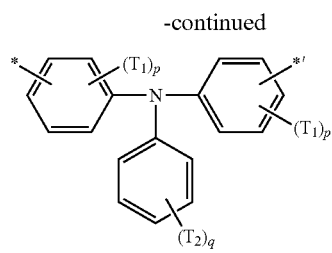

Formula 3k

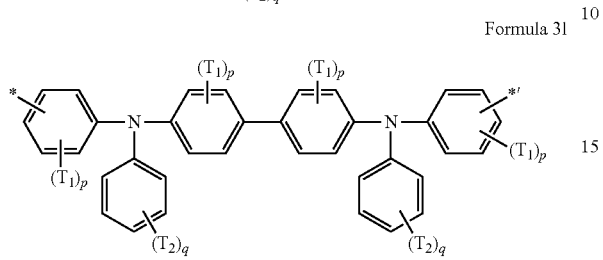

Formula 3l

In the above Formulae 2a through 2x and 3a through 3l, $T_1$ through $T_4$, p, q, r, and s are as defined above.

When n is 1, $Ar_t$ of Formula 1 may be represented by a formula selected from the group consisting of Formulae 2a through 2x.

According to an embodiment, $Ar_t$ of Formula 1 may be represented by Formula 2d, wherein $T_1$ and $T_2$ of Formula 2d may be hydrogen, $T_3$ and $T_4$ may be each independently selected from the group consisting of hydrogen, a $C_1$-$C_{10}$ alkyl group, and a $C_1$-$C_{10}$ alkoxy group.

According to another embodiment, $Ar_1$ of Formula 1 may be represented by Formula 2e, and $T_1$ and $T_2$ of Formula 2e may be hydrogen, and $T_3$ and $T_4$ may be each independently selected from the group consisting of hydrogen, a $C_1$-$C_{10}$ alkyl group, and a $C_1$-$C_{10}$ alkoxy group.

$X_1$ and $X_2$ of Formula 1 may be each independently selected from the group consisting of —O—, —S—, —N($Z_2$)—, and —C($Z_3$)($Z_4$)—.

$Z_2$ through $Z_4$ may be each independently selected one from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group. For example, $Z_2$ through $Z_4$ may each be selected from the group consisting of hydrogen, a $C_1$-$C_{10}$ alkyl group, a $C_1$-$C_{10}$ alkoxy group, a $C_5$-$C_{14}$ aryl group, and a $C_4$-$C_{14}$ heteroaryl group. $Z_2$ through $Z_4$ may each be selected from the group consisting of hydrogen, a $C_1$-$C_{10}$ alkyl group, a $C_1$-$C_{10}$ alkoxy group, a phenyl group, and a naphthyl group, but are not limited thereto.

According to another embodiment, $X_1$ and $X_2$ of Formula 1 both may be —O—.

In Formula 1, $R_1$ and $R_2$ may be each independently selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group. For example, $R_1$ and $R_2$ may each be selected from the group consisting of hydrogen, a substituted or unsubstituted $C_1$-$C_{10}$ alkyl group, a substituted or unsubstituted $C_1$-$C_{10}$ alkoxy group, a substituted or unsubstituted $C_5$-$C_{14}$ aryl group, and a substituted or unsubstituted $C_4$-$C_{14}$ heteroaryl group, but are not limited thereto.

$R_1$ and $R_2$ of Formula 1 may be each independently represented by Formula 4a below:

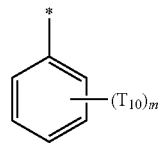

<Formula 4a>

In Formula 4a, $T_{10}$ may be selected from the group consisting of hydrogen, a halogen atom, a hydroxyl group, a cyano group, a $C_1$-$C_{10}$ alkyl group, a $C_1$-$C_{10}$ alkoxy group, a $C_5$-$C_{14}$ aryl group, and a $C_4$-$C_{14}$ heteroaryl group, and m groups of $T_{10}$ of -($T_{10})_m$ may be identical to or different from each other, and m is an integer from 0 through 4.

For example, in Formula 4a, $T_{10}$ in Formula 4a may be selected from the group consisting of hydrogen, a $C_1$-$C_{10}$ alkyl group, and a $C_1$-$C_{10}$ alkoxy group, and m may be 1, but are not limited thereto.

In Formula 1, a and b denote mols of respective units, and may be each independently a number in a range of 0.01 to 0.99, wherein a+b=1.

For example, a and b may be each independently a number in a range of 0.3 to 0.7.

For example, a and b may each be 0.5, but are not limited thereto.

Also, for example, a may be 0.6 to 0.7, and b may be 0.3 to 0.4, but are not limited thereto.

According to another embodiment, in Formula 1, $R_1$ and $R_2$ may be represented by Formula 4a. Thus, the polymer may be represented by Formula 5 below:

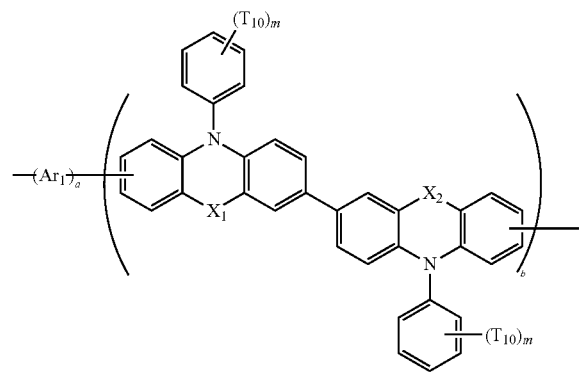

<Formula 5>

In Formula 5, $Ar_1$, $X_1$, $X_2$, $T_{10}$, in, a, and b have been defined above.

According to another embodiment, the polymer may be represented by Formula 5, wherein in Formula 5, $X_1$ and $X_2$ may be —O—.

According to another embodiment, the polymer may be represented by Formula 6 or Formula 7 below:

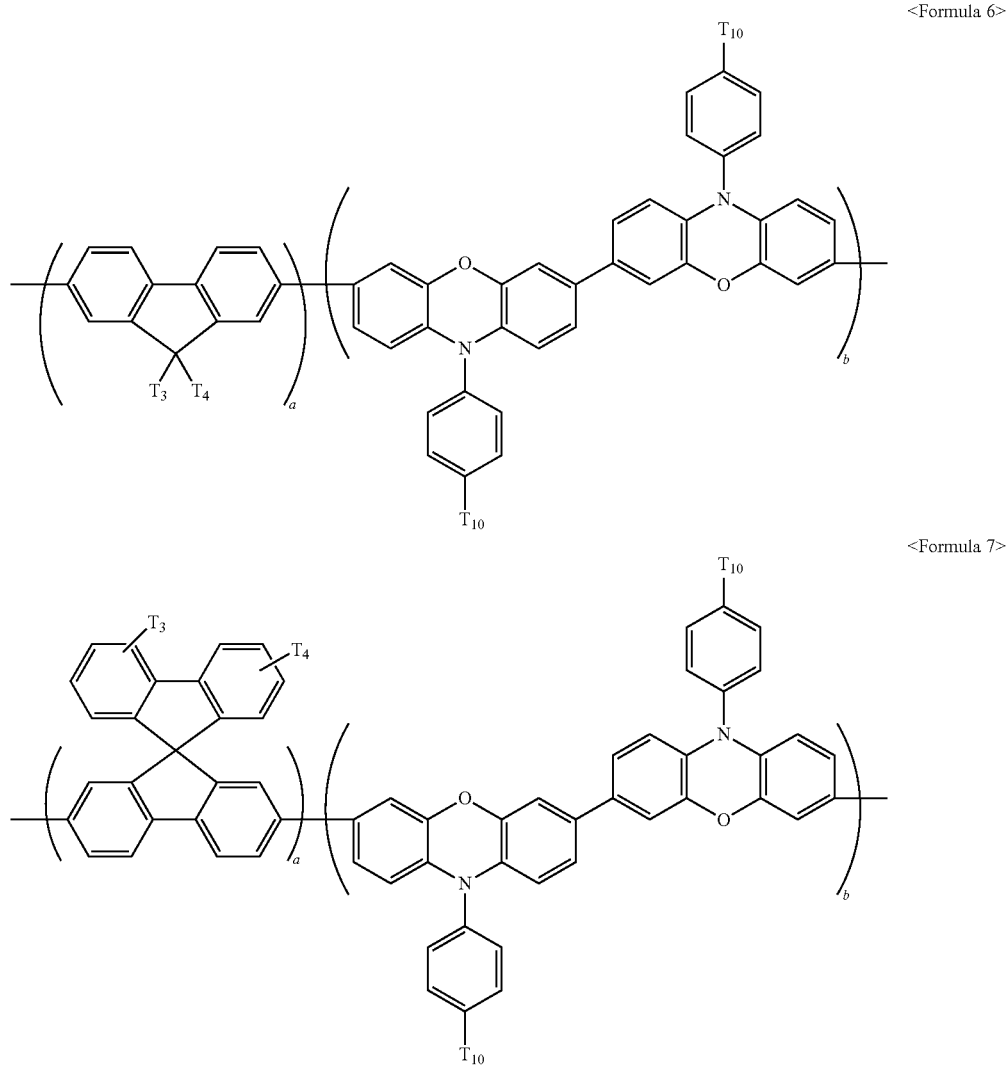

<Formula 6>

<Formula 7>

$T_{10}$, $T_3$, and $T_4$ in Formulae 6 and 7 may be each independently selected from the group consisting of hydrogen, a $C_1$-$C_{10}$ alkyl group, and a $C_1$-$C_{10}$ alkoxy group, and a and b may be each independently a number in a range of 0.01 to 0.99, wherein a+b=1. For example, a and b may be each independently a number from 0.3 to 0.7. Also, for example, a and b may be 0.5, but are not limited thereto. Also, for example, a may be from 0.6 to 0.7, and b may be from 0.3 to 0.4, but are not limited thereto.

The polymer represented by Formula 1 may have a weight average molecular weight (Mw) of from about 10,000 to about 200,000. When the polymer represented by Formula 1 is in the above range of the Mw, a satisfactory thermal stability may be provided.

The polymer of Formula 1 may have a polydispersion index (PDI) of from about 1.5 to about 5. When the polymer represented by Formula 1 has the above-described PDI, a satisfactory thermal stability may be provided.

Although not limited to a specific theory, a first unit represented by

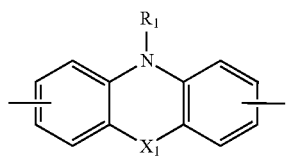

and a second unit represented by

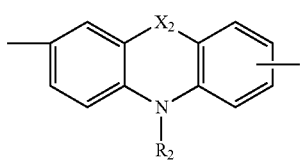

in the units of

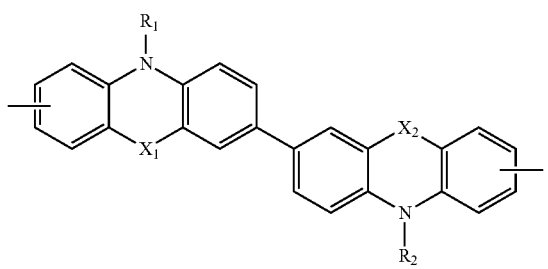

of the polymer represented by of Formula 1 above are positioned in different planes, and thus conjugation between the first and second units is broken. Accordingly, the polymer represented by Formula 1 has an increased band gap, and thus when the polymer is used as a material for a hole transporting layer (HTL), the effect of blocking movement of electrons and excitons in the EML is expected, and thus an OLED having a high efficiency and a long lifetime may be manufactured by using the polymer of Formula 1.

In the current specification, examples of the unsubstituted $C_1$-$C_{30}$ alkyl group (or $C_1$-$C_{30}$ alkyl group) include methyl, ethyl, propyl, isobutyl, sec-butyl, pentyl, iso-amyl, and hexyl. The unsubstituted $C_1$-$C_{30}$ alkyl group may be linear or a branch-type. In the substituted $C_1$-$C_{30}$ alkyl group used herein, at least one hydrogen atom is substituted with one selected from the group consisting of a halogen atom, a hydroxyl group, a nitro group, a cyano group, an amino group, an amidino group, hydrazine, hydrazone, a carboxyl group or salts thereof, a sulfonic acid group or salts thereof, a phosphoric acid or salts thereof, a $C_1$-$C_{30}$ alkyl group, a $C_1$-$C_{30}$ alkenyl group, a $C_1$-$C_{30}$ alkynyl group, a $C_6$-$C_{30}$ aryl group, and a $C_2$-$C_{20}$ heteroaryl group.

In the current specification, the unsubstituted $C_1$-$C_{30}$ alkoxy group (or alkoxy group) is represented by —OA (A is the above-described unsubstituted $C_1$-$C_{30}$ alkyl group), and examples of the unsubstituted $C_1$-$C_{30}$ alkoxy group include methoxy, ethoxy, and isopropyloxy, and at least one hydrogen atom of the alkoxy group may be substituted with a substituent as in the case of the above-described substituted $C_1$-$C_{30}$ alkyl group.

The unsubstituted $C_2$-$C_{30}$ alkenyl group (or $C_2$-$C_{30}$ alkenyl group) refers to a hydrocarbon chain having at least one carbon-carbon double bond in the center or at one end of the alkyl group structure. Examples of the alkenyl group include an ethenyl group, a propenyl group, and a butenyl group. At least one hydrogen atom in the substituted $C_2$-$C_{30}$ alkenyl group is substituted with a substituent as in the case of the above-described substituted $C_1$-$C_{30}$ alkyl group. The substituted or unsubstituted $C_2$-$C_{30}$ alkenylene group refers to a divalent linking group having the same structure as the substituted or unsubstituted $C_2$-$C_{30}$ alkenylene group described above.

The unsubstituted $C_2$-$C_{30}$ alkynyl group (or $C_2$-$C_{30}$ alkynyl group) refers to a hydrocarbon chain having a carbon triple bond in the center or at one end of the $C_2$-$C_{30}$ alkyl group structure. Examples of the unsubstituted $C_2$-$C_{30}$ alkynyl group include acetylene (ethyne), propylene, isopropylacetylene, t-butylacetylene, and the like. At least one hydrogen atom of the substituted $C_2$-$C_{30}$ alkynyl group is substituted with a substituent as in the case of the above-described $C_1$-$C_{30}$ alkyl group.

The unsubstituted $C_5$-$C_{30}$ aryl group is a monovalent group having a carbocyclic aromatic system that includes at least one aromatic ring and has 5 to 30 carbon atoms. The unsubstituted $C_5$-$C_{30}$ arylene group is a divalent group having a carbocyclic aromatic system that includes at least one aromatic ring and has 5 to 30 carbon atoms. When the aryl group and the arylene group respectively include at least two rings, the at least two rings may be fused to each other. At least one hydrogen atom in the substituted $C_5$-$C_{30}$ aryl group and the substituted $C_5$-$C_{30}$ arylene group is substituted with the substituents described with reference to the substituted $C_1$-$C_{30}$ alkyl group.

Examples of the substituted or unsubstituted $C_5$-$C_{30}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene) phenyl group, a (N,N'-dimethylaminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, and an ovalenyl group. Examples of the substituted or unsubstituted $C_5$-$C_{30}$ arylene group may be easily recognized with reference to the examples of the substituted or unsubstituted $C_5$-$C_{30}$ aryl group.

The unsubstituted $C_4$-$C_{30}$ heteroaryl group is a monovalent group having a system including at least one aromatic ring, wherein the system has at least one of the heteroatoms selected from the group consisting of N, O, P, and S and the other ring atoms of the system are all carbon atoms. The unsubstituted $C_2$-$C_{30}$ heteroarylene group is a bivalent group having a system including at least one aromatic ring, wherein the system has at least one of the heteroatoms selected from the group consisting of N, O, P, and S and the other ring atoms of the system are all carbon atoms. In this regard, if the heteroaryl group and the heteroarylene group have at least two rings, they may be fused to each other. At least one hydrogen atom in the heteroaryl group and the heteroarylene group may be substituted with the substituents described with reference to the substituted $C_1$-$C_{30}$ alkyl group.

Examples of the unsubstituted $C_4$-$C_{30}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the substituted or unsubstituted $C_4$-$C_{30}$ heteroarylene group may be easily recognized with reference to the examples of the substituted or unsubstituted $C_4$-$C_{30}$ aryl group.

The polymer of Formula 1 may be synthesized by using a known organic synthesis method such as Suzuki coupling, Yamamoto coupling, etc. The synthesizing method of the polymer may be easily recognized by one having ordinary skill in the art with reference to examples to be described below.

For example, a polymerization reaction using Suzuki coupling may be performed using dihalide and a bisboronic acid or a bisborolane derivative in the presence of a palladium (0) catalyst under a basic condition.

Also, for example, a polymerization reaction using Yamamoto coupling may be performed using only dihalide as a monomer in the presence of a nickel (0) catalyst, a base, and an additional ligand.

When synthesizing the polymer, the purity of the polymer is preferably high because low-molecular weight organic materials, ions, or other inorganic impurities may aggravate the light emitting characteristics (particularly, the lifetime characteristics) of an OLED manufactured using the polymer. Accordingly, by refining a crude polymer by using a repetitive precipitation method, a filter, a Soxhlet extractor, or the like, the purity of a final polymer may be improved.

For example, Reaction Scheme 1A below is a reaction for synthesizing the polymer represented by Formula 1:

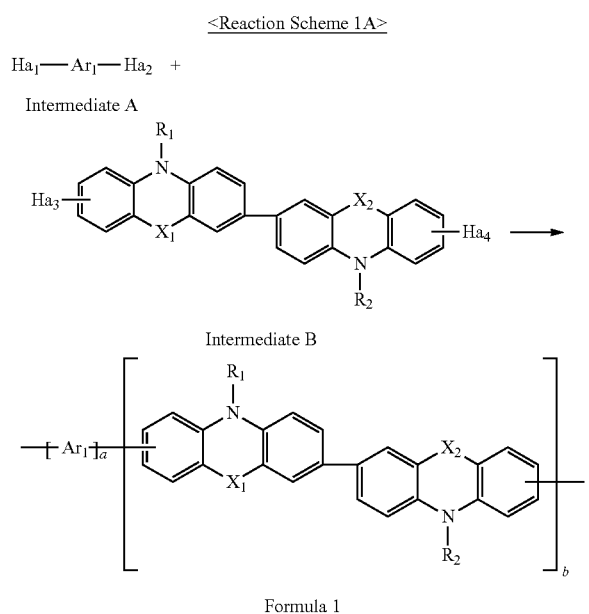

In Reaction Scheme 1A, Ar1, X1, X2, R1, R2, a, and b Ar1, X1, X2, R1, R2, a, and b have been defined above. In Reaction Scheme 1A, each of Ha1 and Ha2 may be —B(OH)$_2$ or a halogen atom, for example, —F, —Cl, —Br or —I, or, but is not limited thereto. Each of Ha3 and Ha4 may be a halogen atom, for example, —F, —Cl, —Br or —I, but is not limited thereto.

Reaction Scheme 1A illustrates an example of a method of synthesizing the polymer represented by Formula 1. One of ordinary skill in the art may synthesize the polymer of Formula 1 by using an organic synthesizing method well known in the art with reference to Reaction Scheme 1A and Formula 1.

A first layer including the polymer represented by Formula 1 may be disposed between a first electrode and a second electrode of an OLED that includes a substrate, the first electrode, and the second electrode. Accordingly, an OLED including the substrate, the first electrode, the second electrode, and the polymer represented by Formula 1 and disposed between the first electrode and the second electrode is manufactured.

The first layer may be a HTL or an electron transporting layer (ETL), but is not limited thereto. For example, the first layer may be a HTL.

The OLED may include at least one layer selected from the group consisting of a conductive buffer layer, a hole injection layer (HIL), an HTL, an emissive layer (EML), a hole blocking layer (HBL), an ETL, and an electron injection layer (EIL) between the first electrode and the second electrode. For example, as illustrated in FIG. 1, the OLED may have a structure in which a substrate, a first electrode, a conductive buffer layer, a first layer which functions as an HTL, an EML, an ETL, an EIL, and a second electrode are sequentially stacked.

Hereinafter, a structure of the OLED and a method of manufacturing the OLED according to an embodiment will be described with reference to FIG. 1.

The substrate, which may be any substrate that is used in conventional organic light-emitting devices, may be a glass substrate or a transparent plastic substrate with excellent mechanical strength, thermal stability, transparency, surface smoothness, ease of handling, and waterproofness.

The first electrode may be formed by depositing or sputtering a material that is used to form the first electrode on the substrate. When the first electrode constitutes an anode, the material used to form the first electrode may be a high work-function material so as to facilitate hole injection. The first electrode may be a reflective electrode or a transmission electrode. Transparent and conductive materials such as ITO, IZO, SnO2, and ZnO may be used to form the first electrode. Alternatively, the first electrode may be formed using magnesium (Mg), aluminum (Al), aluminum-lithium (Al—Li), calcium (Ca), magnesium-indium (Mg—In), magnesium-silver (Mg—Ag), or the like.

The conductive buffer layer may be disposed on the first electrode. The conductive buffer layer may be formed by spin coating, casting, Langmuir Blodgett (LB) deposition, or the like.

When the conductive buffer layer is formed using spin coating, coating conditions may vary according to a compound that is used to form the conductive buffer layer and the structure and thermal properties of the conductive buffer layer to be formed. For example, the coating conditions may include a coating speed of about 2000 rpm to about 5000 rpm, and a thermal treatment temperature of about 80° C. to about 200° C., wherein the thermal treatment is for removing a solvent after coating.

Examples of a material for the conductive buffer layer include polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly (4-styrene-sulfonate) (PANI/PSS), but are not limited thereto.

The thickness of the conductive buffer layer may be from about 100 Å to about 10000 Å, for example, the thickness of the conductive buffer layer may be from about 100 Å to about 1000 Å. When the thickness of the conductive buffer layer is within this range, the HIL may have an excellent hole injecting ability without a substantial increase in a driving voltage.

Although not illustrated in FIG. 1, an HIL may further be included between the conductive buffer layer and the substrate or on the conductive buffer layer.

The HIL may be formed by vacuum deposition, spin coating, casting, LB deposition, or the like.

When the HIL is formed by vacuum deposition, vacuum deposition conditions may vary according to a compound that is used to form the HIL and the desired structure and thermal properties of the HIL to be formed. In general, however, the vacuum deposition may be performed at a deposition temperature of about from 100° C. to about 500° C., under a pressure of from about $10^{-8}$ torr to about $10^{-3}$ torr, and at a deposition speed of from about 0.01 Å/sec to about 100 Å/sec.

When the HIL is formed by spin coating, conditions for the spin coating may vary according to a compound that is used to form the HIL, and the desired structure and thermal properties of the HIL to be formed; however, the conditions may be selected from the coating conditions for the conductive buffer layer.

The HIL may be formed of any material that is commonly used to form an HIL. Examples of the material that can be used to form the HIL include N,N'-diphenyl-N,N'-bis-[4-(phenyl-m-tolyl-amino)-phenyl]-biphenyl-4,4'-diamine (DNTPD), a phthalocyanine compound such as copperphthalocyanine, 4,4',4''-tris (3-methylphenylphenylamino) triphenylamine (m-MTDATA), N,N'-di(1-naphthyl)-N,N'-diphenylbenzidine (NPB), TDATA, 2T-NATA, but are not limited thereto.

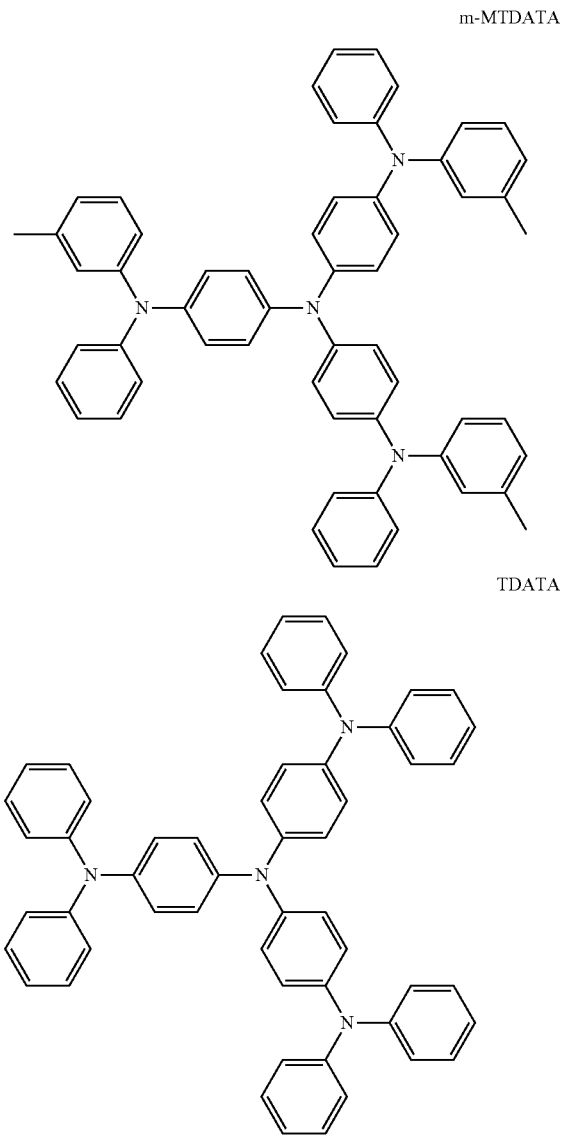

m-MTDATA

TDATA

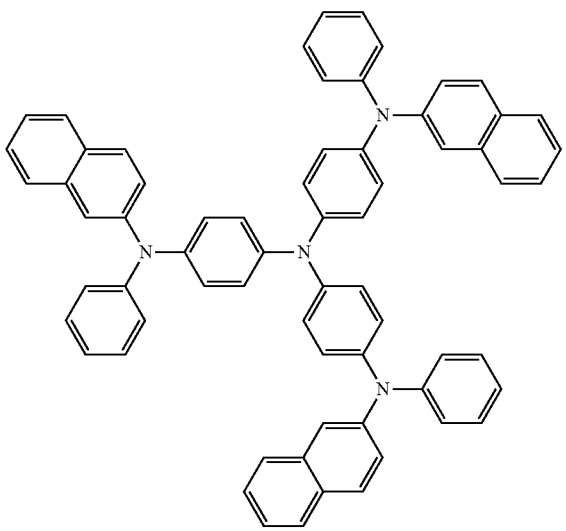

2T-NATA

The thickness of the HIL may be from about 100 Å to about 10000 Å, for example, the thickness of the HIL may be from about 100 Å to about 1000 Å. When the thickness of the HIL is within this range, the HIL may have an excellent hole injecting ability without a substantial increase in a driving voltage.

A first layer including the polymer represented by Formula 1 may be formed as an HTL on the conductive buffer layer (or on the HIL, if HIL is formed) by vacuum deposition, spin coating, casting, LB deposition, or the like. Conditions for forming the first layer may be selected among, for example, the coating conditions for the conductive buffer layer.

The thickness of the HTL including the polymer represented by Formula 1 may be from about 50 Å to about 1000 Å, and for example, the thickness of the HTL including the polymer represented by Formula 1 may be from about 100 Å to about 800 Å. When the thickness of the HTL is within the range described above, the HTL may have excellent hole transporting ability without a substantial increase in driving voltage.

Then, an EML may be formed on the HTL including the polymer represented by Formula 1 by vacuum deposition, spin coating, casting, LB deposition, or the like. When the EML is formed by vacuum deposition or spin coating, the conditions for deposition and coating may be similar to those for the formation of the conductive buffer layer or the HIL, although the conditions for deposition and coating may vary according to the material that is used to form the EML.

The EML may be formed of a light emitting material or a combination of a host and a dopant. Examples of the host include Alq3,4,4'-N,N'-dicarbazole-biphenyl (CBP), poly(n-vinylcarbazole) (PVK), 9,10-di(naphthalene-2-Aanthracene (ADN), TCTA, 1,3,5-tris(N-phenylbenzimidazole-2-yl)benzene (TPBI), 3-tert-butyl-9,10-di-2-naphthylanthracene (TBADN), E3, and distyrylarylene (DSA), but are not limited thereto.

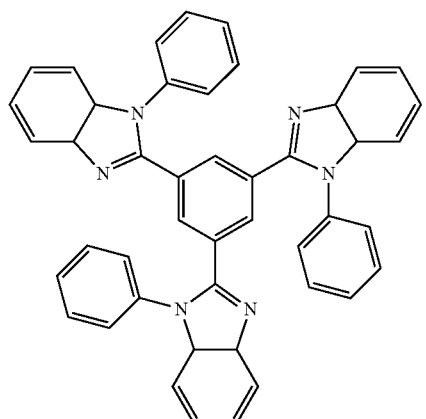
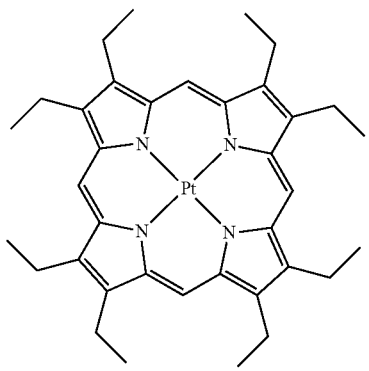
Also, examples of green dopants include Ir(ppy)₃ (ppy=phenylpyridine), Ir(ppy)₂(acac), and Ir(mpyp)₃, but are not limited thereto.
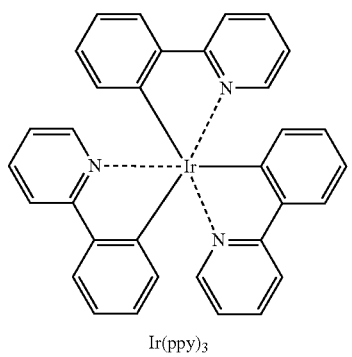
Examples of known red dopants include PtOEP, Ir(piq)₃, and Btp₂Ir(acac), but are not limited thereto.

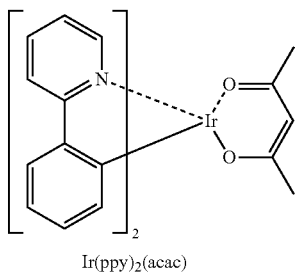
Ir(ppy)₂(acac)
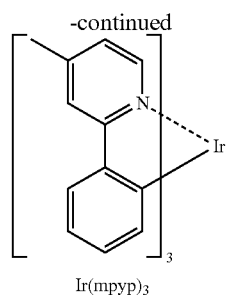
Ir(mpyp)₃
Examples of blue dopants include F₂Irpic, (F₂ppy)₂Ir(tmd), Ir(dfppz)₃, terfluorene, 4,4'-bis(4-diphenylaminostyryl)biphenyl (DPAVBi), and 2,5,8,11-tetra-t-butyl pherylene (TBPe), but are not limited thereto.
F₂Irpic
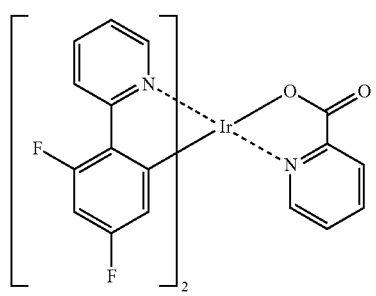
(F₂ppy)₂Ir(tmd)
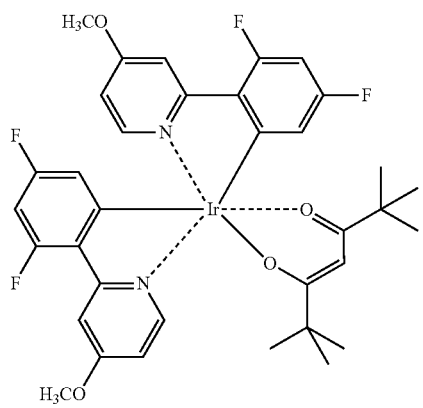
Ir(dfppz)₃
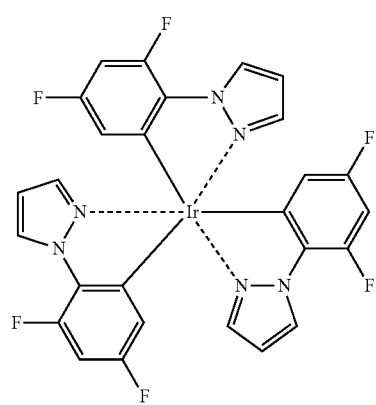

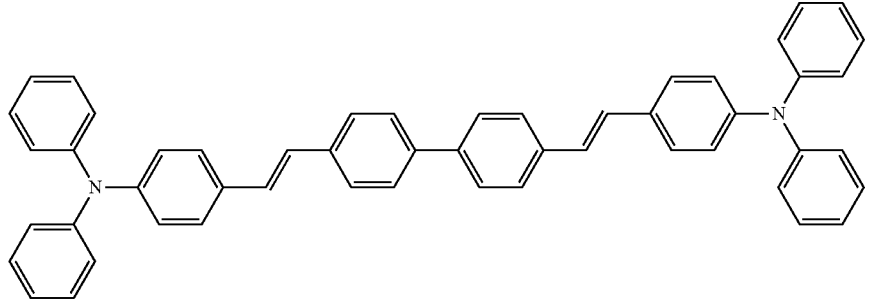
DPAVBi

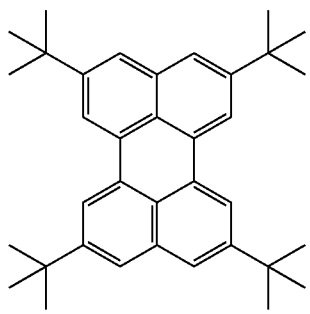
TBPe

When the EML include a host and a dopant, the content of the dopant may be from about 0.01 to about 15 parts by weight based on 100 parts by weight of the host, but is not limited thereto.

The thickness of the EML may be from about 100 Å to about 1000 Å, and for example, the thickness of the EML may be from about 200 Å to about 600 Å. When the thickness of the EML is within this range, the EML may have excellent light emitting ability without a substantial increase in a driving voltage.

An HBL may be formed between the HTL and the EML using vacuum deposition, spin coating, casting, LB deposition, or the like, to prevent diffusion of triplet excitons or holes into an ETL when a phosphorescent dopant is used to form the EML. When the HBL is formed using vacuum deposition or spin coating, the conditions for deposition and coating may be similar to those for the formation of the conductive buffer layer or the HIL, although the conditions for deposition and coating may vary according to the material that is used to form the HBL. Any material that is commonly used to form a HBL may be used. Examples of materials for forming the HBL include an oxadiazole derivative, a triazole derivative, and a phenanthroline derivative, but are not limited thereto.

The thickness of the HBL may be from about 50 Å to about 1000 Å, and for example, the thickness of the HBL may be from about 100 Å to about 300 Å. When the thickness of the HBL is within this range, the HBL may have an excellent hole blocking ability without a substantial increase in a driving voltage.

Then, an ETL may be formed on the EML by vacuum deposition, spin coating, casting, or the like. When the ETL is formed by vacuum deposition or spin coating, the deposition and coating conditions may be similar to those for formation of the conductive buffer layer or the HIL, although the deposition and coating conditions may vary according to a compound that is used to form the ETL. A material that is used to form the ETL may be a material that can stably transport electrons injected from the electron injecting electrode (cathode) and any known material may be used. Examples of materials for forming the ETL include a quinoline derivative, tris(8-quinolinorate)aluminum (Alq$_3$), TAZ, and Balq, beryllium bis(benzoquinolin-10-olate: Bebq$_2$), but are not limited thereto.

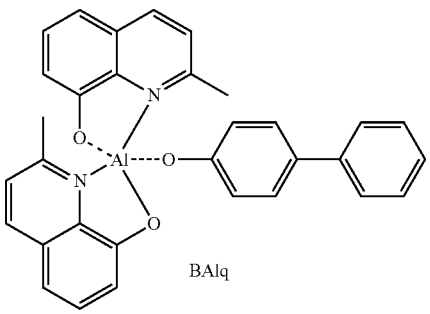
BAlq

TAZ

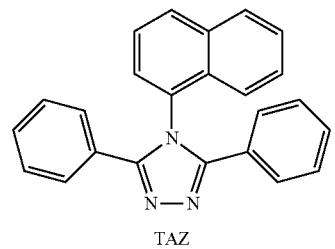
TAZ

The thickness of the ETL may be from about 100 Å to about 1000 Å, and for example, the thickness of the ETL may be from about 150 Å to about 500 Å. When the thickness of the ETL is within this range, the ETL may have satisfactory electron transporting ability without a substantial increase in a driving voltage.

Then, an ETL may be formed on the ETL. The EIL may be formed of any material allowing electrons to be easily injected from the cathode.

Examples of materials for forming the EIL include LiF, NaCl, CsF, $Li_2O$, and BaO, which are known in the art. Deposition and coating conditions for forming the EIL are similar to those for formation of the HIL, although the deposition and coating conditions may vary according to a material that is used to form the EIL.

The thickness of the EIL may be from about 1 Å to about 100 Å, for example, the thickness of the EIL may be from about 3 Å to about 90 Å. When the thickness of the EIL is within this range, the EIL may have satisfactory electron injection ability without a substantial increase in a driving voltage.

A second electrode is formed on the EIL. The second electrode may be a cathode that is an electron injection electrode. A metal for forming the second electrode may be a metal, an alloy, an electro-conductive compound, or mixtures thereof that respectively have a low work function. The second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In addition, the transmission electrode may be formed of ITO or IZO to manufacture a top-emission type light-emitting device.

The method of manufacturing an OLED including the first layer including the polymer represented by Formula 1 which functions as a HTL has been described above; however, the first layer including the polymer represented by Formula 1 may also function not only as an HTL but also an EML, an ETL, or the like, according to the substituent included in the first layer.

In an OLED according to another embodiment, in which the first layer functions as an EML and/or ETL, the HTL may be formed by using known hole transporting materials. Examples of the hole transporting material include: a carbazole derivative such as N-phenylcarbazole or polyvinylcarbazole; an amine derivative having an aromatic condensation ring, such as N,N'P-bis(3-methylphenyl)-N,N'-diphenyl-[1,1-biphenyl]-4,4'-diamine (TPD) illustrated below or N,N'-di(naphthalene-1-yl)-N,N'-diphenyl benzidine (α-NPD) illustrated below; and a triphenylamine-based material, such as 4,4',4"-tris(N-carbazolyl)triphenylamine (TCTA). Among these materials, TCTA may not only transport holes but also inhibit excitons from being diffused into the EML.

a-NPD

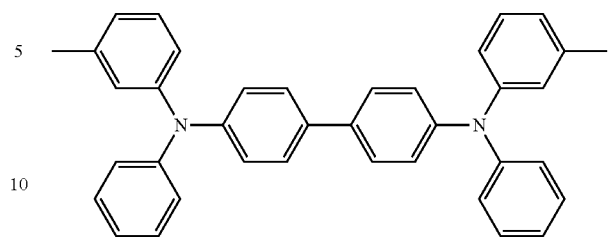

TPD

Hereinafter, an OLED according to an embodiment will be described in detail with reference to synthesis examples and exemplary embodiments below. However, these examples are not intended to limit the purpose and scope of the present embodiments below.

EXAMPLES

Synthesis Example 1

Synthesis of Compound (e) (phenoxazine dimer)

Compound (e) (phenoxazine dimer) was synthesized through Reaction Scheme 2 below:

<Reaction Scheme 2>

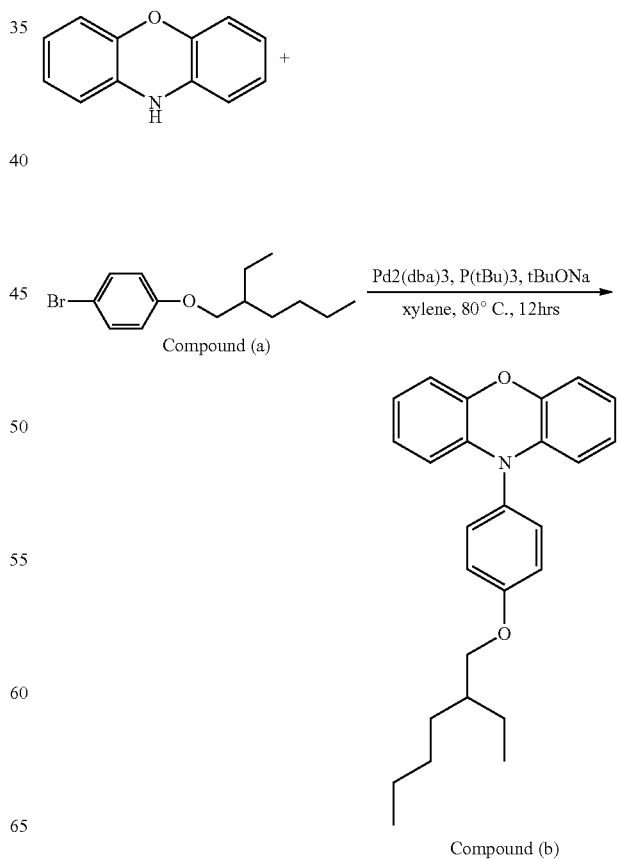

Compound (b)

-continued

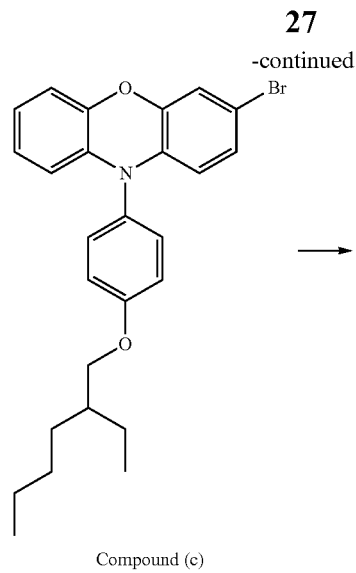

Compound (c)

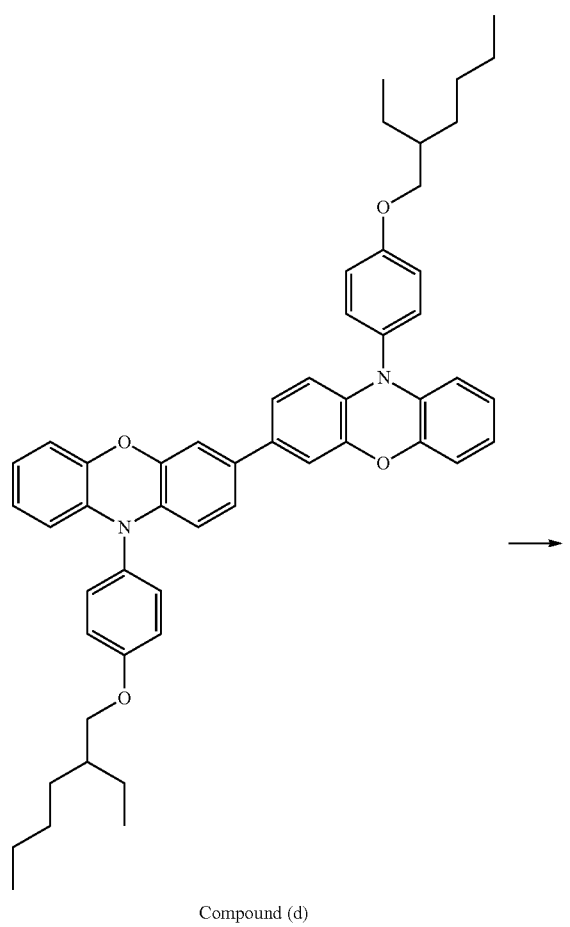

Compound (d)

-continued

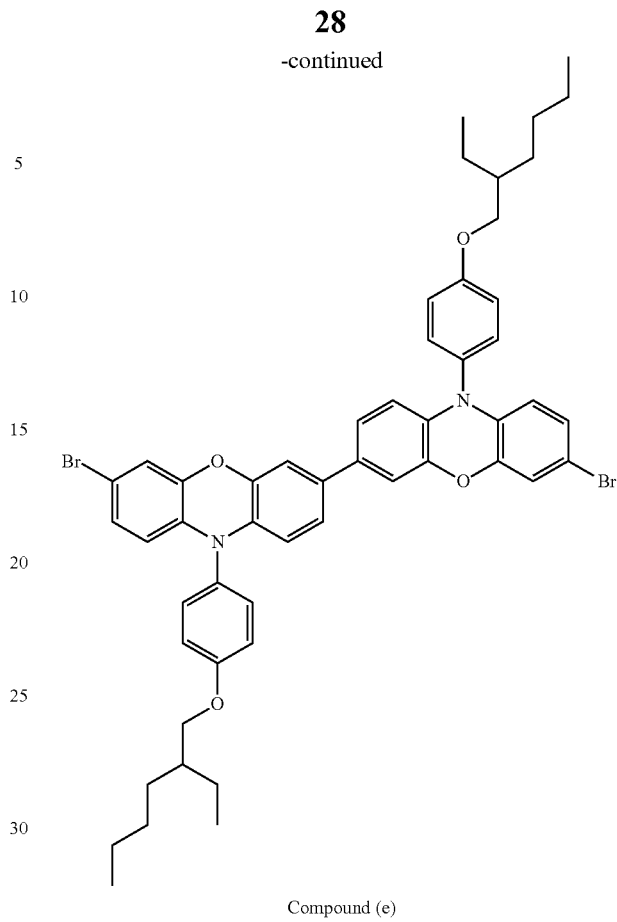

Compound (e)

Preparation of Compound (a)

50 g (0.29 moles) of 4-bromophenol was dissolved in acetone (500 ml), and 48.4 g (0.35 mole) of $K_2CO_3$ was added to this reaction mixture. Next, 73.3 g (0.38 mole) of 1-bromooctane was added to the mixture and the resultant mixture refluxed for 24 hours. After the reaction was completed, the reaction mixture was extracted by using a solution containing water and $CHCl_3$ in a volume ratio of 2:1, to remove $K_2CO_3$, thereby obtaining an organic layer. The organic layer was concentrated then dried over $MgSO_4$, and the concentrate was chromatography on silica gel column using hexane as an eluant. The obtained effluent was distilled under a reduced pressure to remove unreacted 1-bromooctane, yielding 80 g of Compound (a) (yield: 96%).

Preparation of Compound (b)

18 g (64 mmol) of Compound (a), 10 g (54 mmol) of phenoxazine, 7.4 g (77 mmol) of sodium tert-butoxide, 0.61 g (1.1 mmol) of $Pd_2(dba)_3$, [Tris(dibenzylidine acetone) dipalladium(0))], and 0.22 g of (1.1 mmol) of tri(tert-butyl)phosphine were dissolved in 250 ml of xylene, and reacted at 80° C. for 12 hours. After the reaction was completed, the reaction mixture was cooled to room temperature, and then 200 ml of distilled water was added thereto and the mixture was extracted with a mixture of xylene and water in a volume ratio of 1:1, thereby obtaining an organic layer. The organic layer was concentrated and dried over $MgSO_4$, then subjected to silica gel column chromatography eluent with a solution containing toluene and hexane in a volume ratio of 1:2. The effluent was concentrated and dried, yielding 18.5 g (yield: 88%) of Compound (b).

Preparation of Compound (c)

5 g (13 mmol) of Compound (b) was dissolved in 150 ml of $CHCl_3$, and bromine in an amount of 1 equivalent with respect to Compound (b) was slowly added to the solution while the temperature was maintained at 0° C. When removal of the starting material was identified through thin layer chro matography (TLC), addition of the bromine to the mixture was stopped, and the reaction mixture was stirred for 10 minutes and then the reaction was stopped. A small amount of acetone was added to the reaction mixture to quench bromine, and the reaction mixture was extracted using a solution of water and CHCl₃ in a volume ratio of 2:1, thereby obtaining an organic layer. The organic layer was concentrated and dried using MgSO₄, and re-precipitated with MeOH, yielding 6 g (yield: 85%) of Compound (c). A structure of Compound (c) was identified by 1H-NMR:

1H-NMR (300 MHz, CDCl3): δ0.91 (m, 6H), δ1.45 (m, 8H), δ1.82 (m, 1H), δ3.89 (d, 2H), δ5.82 (d, 2H), δ6.5-7.5 (m, 9H).

Preparation of Compound (d)

A Schlenk flask was subjected to reveal squeeze pump thaw agates under notrogen to completely eliminate water, and then 880 mg (3.2 mmol) of bis 1,5-cyclooctadiene nickel and 500 mg (3.2 mmol) of bipyridal were combined in a glove box, and the flask was subjected and refluxed under a nitrogen atmosphere again several times. Next, under a nitrogen atmosphere, 10 ml of anhydrous dimethylfuran (DMF), 346 mg (3.2 mmol) of 1,5-cyclooctadiene (COD), and 10 ml of anhydrous toluene were added thereto. After stirring at 80° C. for 30 minutes, 0.746 g (0.16 mmol) of Compound (c) diluted in 10 ml of toluene was added to the reaction mixture. Next, 10 ml of toluene was added to the reaction mixture while removing materials attached to walls of the flask, and the resultant solution was stirred at 80° C. for 2 hours. After the stirring was completed, the temperature of the reaction solution was reduced to 60° C., and then the reaction solution was poured into a solution of HCl:acetone:methanol (1:1:2) to form preciptable. The precipitate was dissolved in chloroform, and the an organic layer was dried using MgSO₄ and concentrated, and silica gel column chromatography was performed on the concentrated using toluene and hexane in a volume ratio of 3:7 as the eluant. The effluent was concentrated and dried, to yield 0.5 g of Compound (d).

1H-NMR (300 MHz, CDCl3): δ0.93 (12H), δ1.48 (16H), δ1.80 (2H), δ3.92 (4H), δ5.85 (4H), δ6.3~7.7 (18H)

Preparation of Compound (e)

0.5 g (0.647 mmol) of Compound (d) was dissovled in CHCl₃, and 2.1 equivalent of bromine was slowly added thereto while maintaining a temperature at 0° C. The reaction mixture was stirred for 10 minutes and then the reaction was stopped. By adding a small amount of acetone to the reaction mixture, the bromine was quenched and then extracted by using a solution containing water and chloroform in a volume ratio of 2:1, thereby obtaining an organic layer. The organic layer was concentrated by drying using anhydrous magnesium sulfate, and re-precipitated in methanol, yielding 580 mg (yield: 96%) of Compound (e).

1H NMR (300 MHz, CDCl3) δ0.93 (12H), δ1.48 (16H), δ1.80 (2H), δ3.92 (4H), δ5.92 (4H), δ6.2~7.9 (18H)

Synthesis Example 2

Synthesis of Polymer 1

Polymer 1 was synthesized through Reaction Scheme 3 below:

<Reaction Scheme 3>

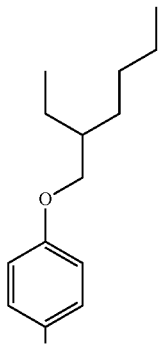

-continued
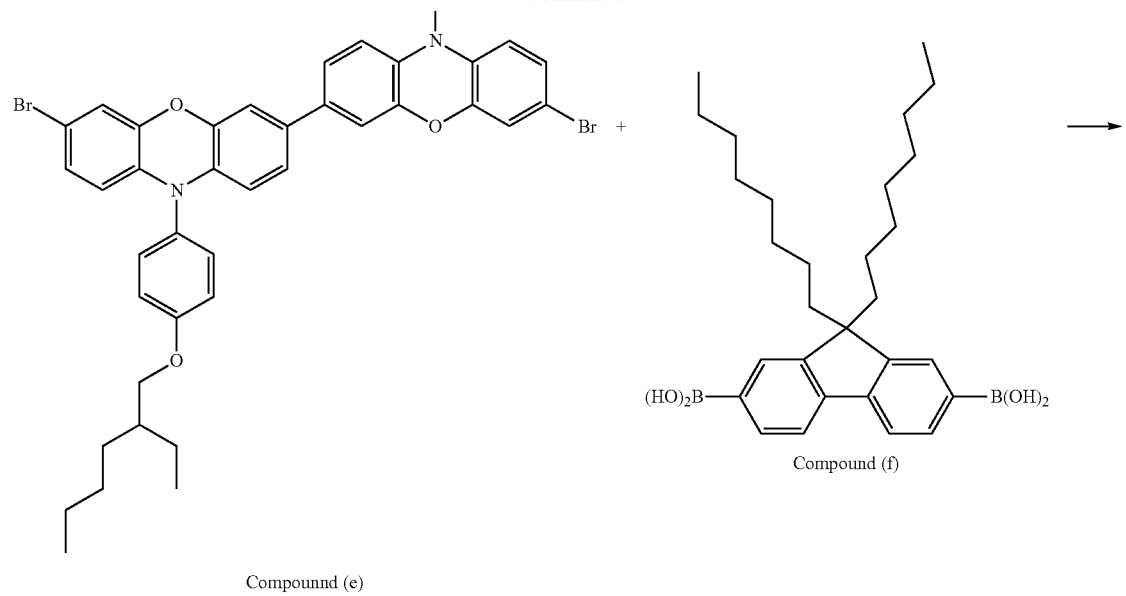
Compound (e)
Compound (f)
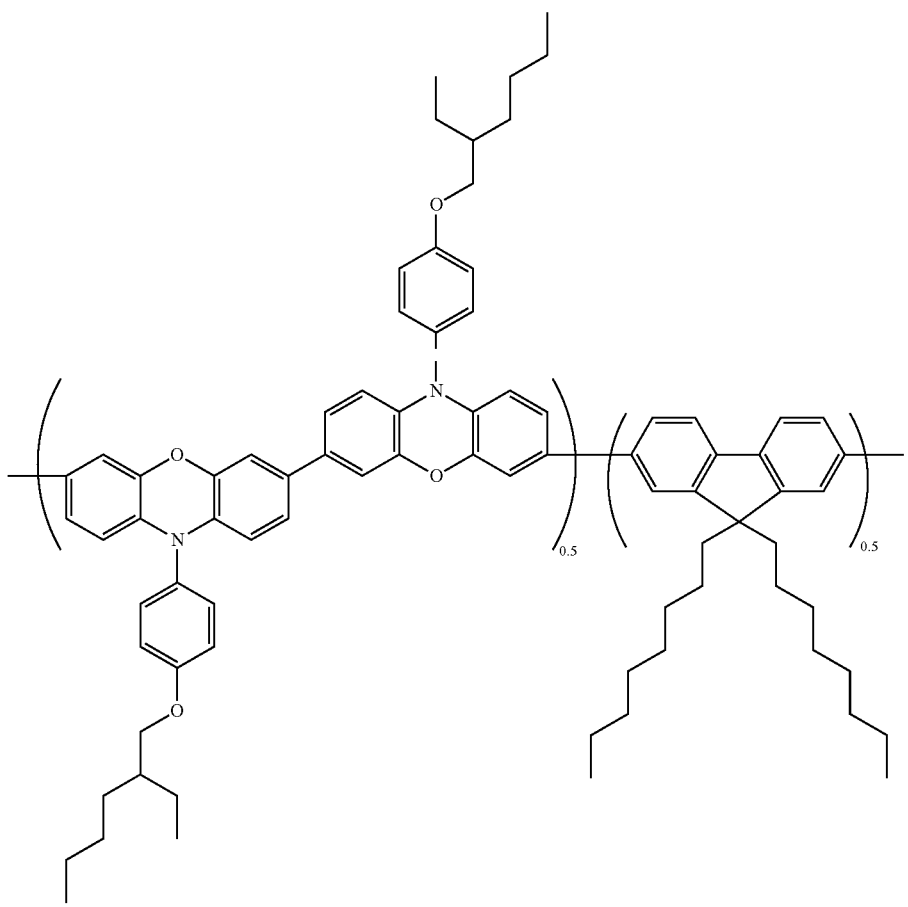
Polymer 1

9.31 g (10.00 mmol) of Compound (e) and 4.83 g (10.1 mmol) of Compound (f), and 4.15 g (30.00 mmol) of $K_2CO_3$ were melted in a mixture solution of 50 ml of toluene, 50 ml of water, and 0.5 ml of ethanol, and 230 mg (0.02 mmol) of $Pd(PPh_3)_4$ was added thereto under a nitrogen atmosphere. The reactant mixture was stirred under $N_2$ at a temperature of 87° C. and was lightly refluxed. After three days, 16 mg of bromobenzene was added to the reaction mixture. The mixture was then refluxed for 1 day. After the reaction was completed, the solution was diluted using toluene, and poured into methanol to form a precipitate. The precipitate was washed with water and methanol and then filtered, thereby obtaining a solid. The solid was dissolved in 30 ml of toluene, filtered using a column filled with silica gel and then concentrated. The concentrate was dissolved in 200 ml of THF, precipitated in with MeOH, and washed and dried under reduced pressure. The mold was re-precipitated in 200 ml of THF and 250 ml of methanol, filtered under reduced pressure, and dried precipitate yielding, 4.6 g of Polymer 1. Polymer 1 was analyzed by using a gel permeation chromatography (GPC). Polymer 1 had a weight average molecular weight (Mw) of 95,000 and the molecular weight distribution of Polymer 1 was 2.58.

Synthesis Example 3

Synthesis of Polymer 2

Polymer 2 was synthesized according to Reaction Scheme 4 below:

<Reaction Scheme 4>

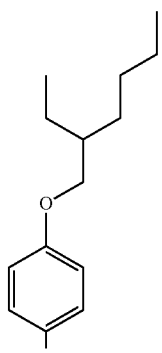

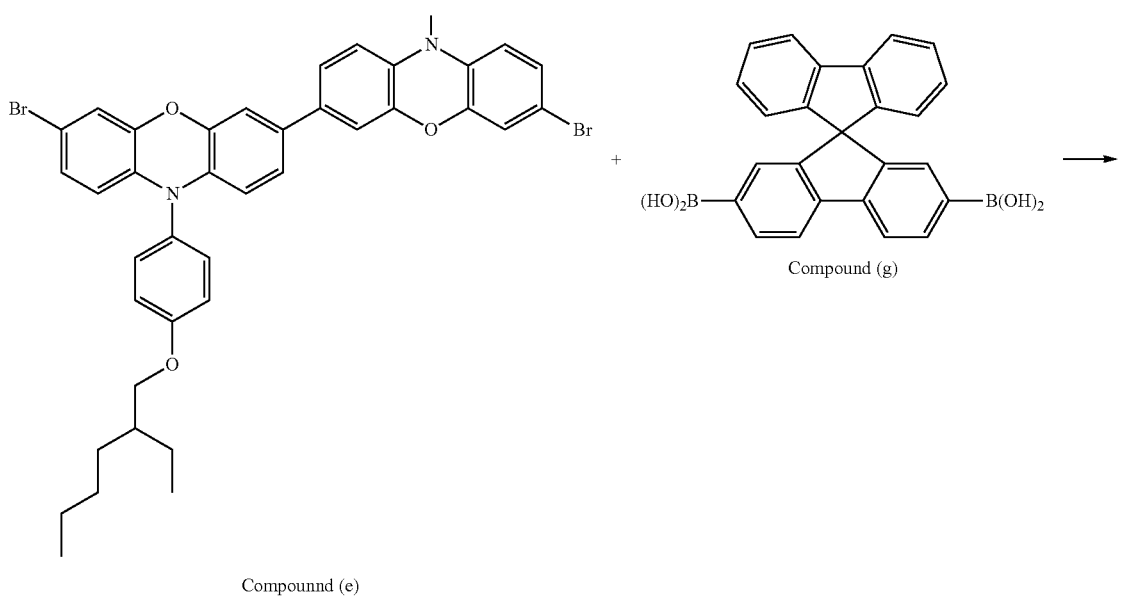

Compounnd (e)

Compound (g)

-continued
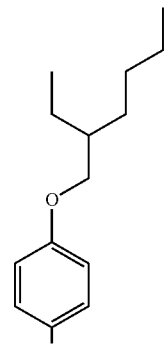
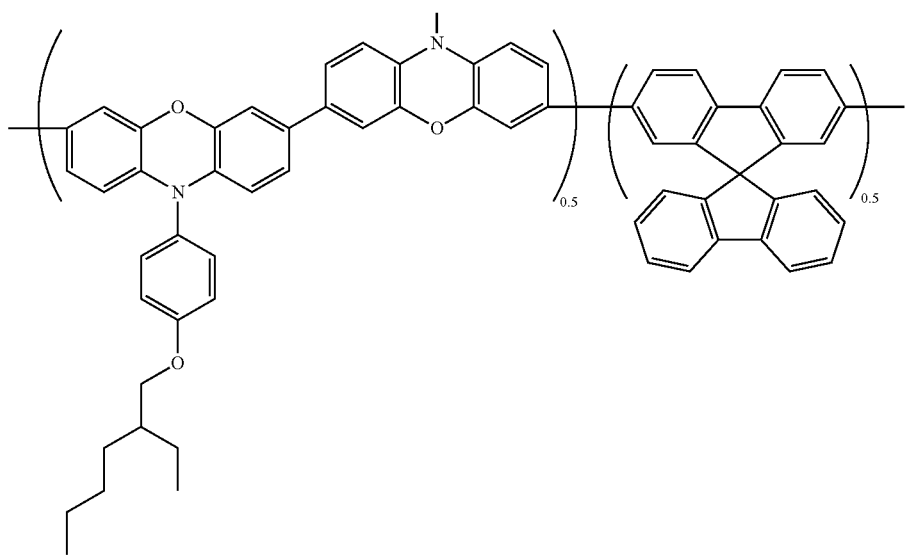
Polymer 2

9.31 g (10.00 mmol) of Compound (e) and 4.08 g (10.1 mmol) of Compound (g), and 4.15 g (30.00 mmol) of $K_2CO_3$ were dissovled in a mixture solution of 50 ml of toluene, 50 ml of water, and 0.5 ml of ethanol, and 230 mg (0.02 mmol) of $Pd(PPh_3)_4$ was added thereto under a nitrogen atmosphere. The reactions mixture was lightly refluxed while stirring at a temperature of 87° C. under a nitrogen atmosphere. After three days, 16 mg of bromobenzene was added to the mixture. The reaction mixture was then refluxed for 1 day. After the reaction was completed, the solution was diluted using toluene, and poured into methanol to form a precipitate. The precipitates were washed using water and methanol and then filtered, thereby obtaining a solid. The solid was dissolved in 30 ml of toluene, filtered on a silica gel then concentrated. The concentrate was dissolved in 200 Ml of THF, precipitated in 300 ml of MeOH, and washed and dried under a lightly reduced pressure to yield a solid. The solid was re-precipitated in 200 ml of THF and 300 ml of methanol, filtered and dried yielding 3.7 g of Polymer 2. Polymer 2 was analyzed by using GPC. As a result Polymer 2 had a weight average molecular weight (Mw) of Polymer 2 was 63,000 and it had a molecular weight distribution of 2.8.

Synthesis Example 4

Synthesis of Polymer 3

Polymer 3 was synthesized according to Reaction Scheme 5 below:

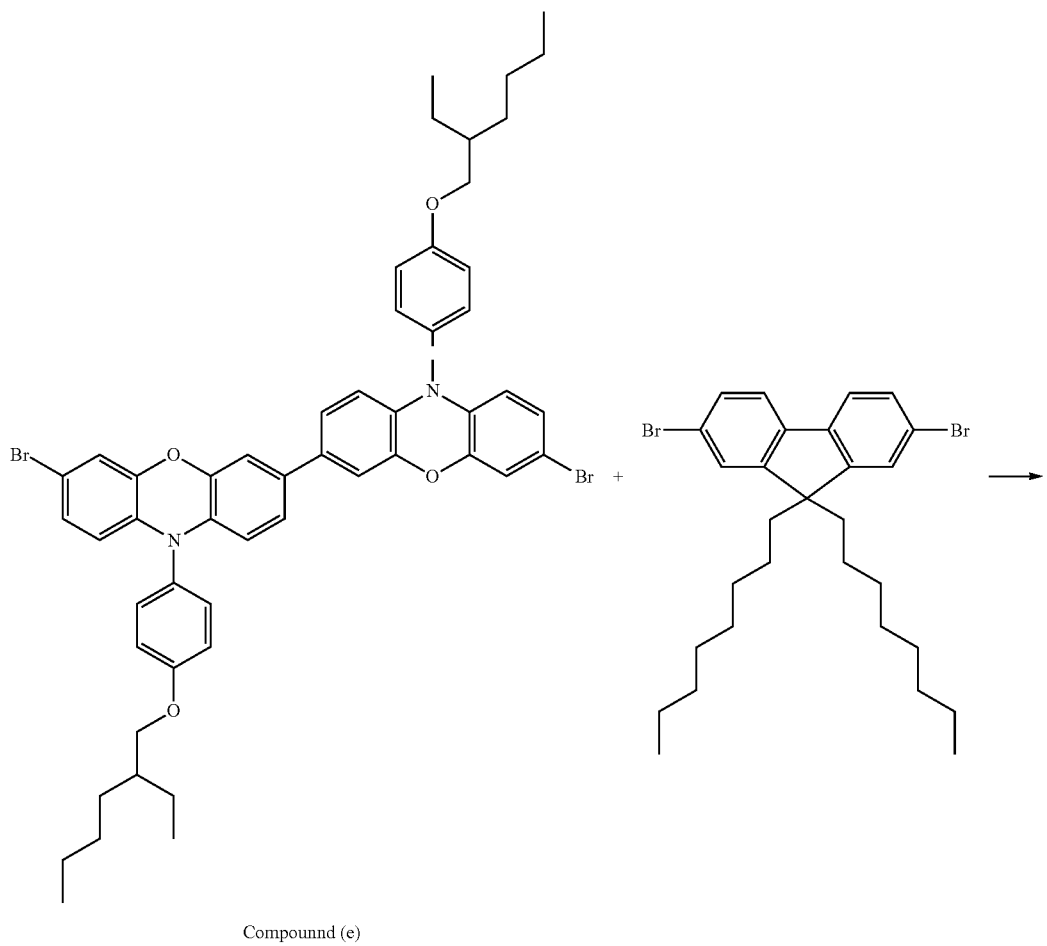

Compounnd (e)

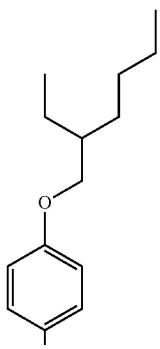

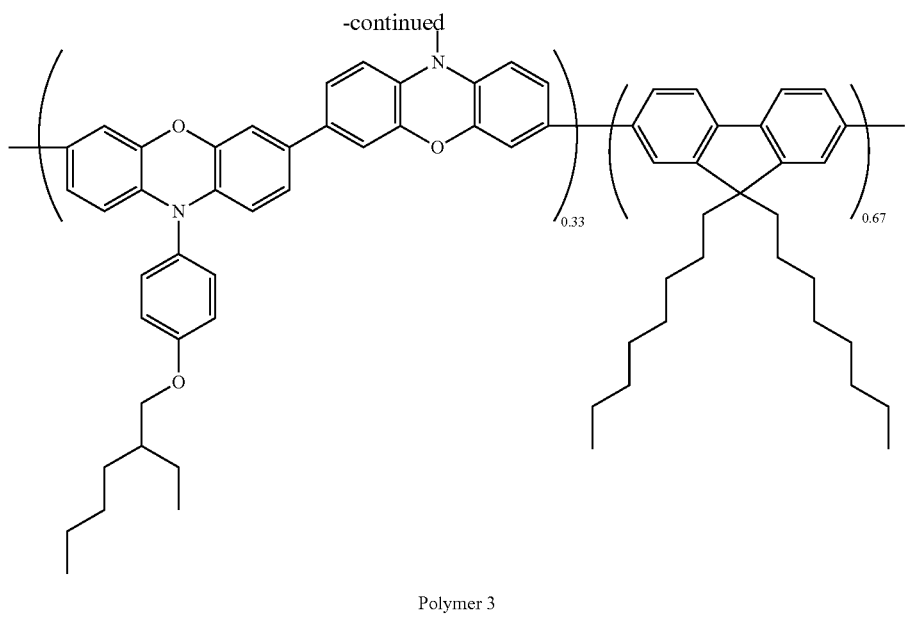

Polymer 3

4.13 g (15.0 mmol) of Ni(COD)$_2$ and 2.31 g (15.0 mmol) of 2-2'-bipyridyl were transferred to a flask in a glove box followed by the addits global on "thereto" 75 ml of dimethylformamide and 240 ml of toluene, the reaction mixture was heated at 80° C. under a nitrogen atmosphere. After 30 minutes, 1.84 ml (15.0 mmol) of 1,5-cyclooctadiene was added to the mixture, and 5.48 g (10 mmol) of 9,9'-dioctyl-2,7-dibormofluorene, and 4.65 g (5 mmol) of Compound (e) were diluted in 100 ml of toluene this mixture was added to the reaction mixture. After 5 days, 1 ml of bromobenzene was added to the reaction mixture, and the solution was stirred for an additional 1 day. After stirring, the resultant mixture was cooled to room temperature, and then 20 ml of a mixture solution containing 1N HCl and methanol (1:2) was added to the solution and stirred for 30 minutes resulting in a precipitate. The precipitate was dissolved in 30 ml of toluene, filtered using a silica gel column and then concentrated. The concentrate was dissolved in 100 ml of THF, precipitated with 300 ml of methanol twice, and then dissolved in 50 ml of toluene and precipitated with 300 ml of acetone, filtered and dried, yielding Polymer 3. Polymer 3 was analyzed by using GPC. The weight average molecular weight (Mw) of Polymer 3 was 76,000 and it had a molecular weight distribution of 3.2.

Example 1

As an anode, a 15 Ω/cm$^2$ (1200 Å) ITO glass substrate by Corning, was cut to a size of 50 mm×50 mm×0.7 mm, ultrasonically washed with isopropyl alcohol and pure water for 5 minutes each, and then washed with UV ozone for 30 minutes. Next, PEDOT:PSS (AI4083, available by H. C. Stark) was coated on the ITO in the ITO glass with a thickness of about 600 Å, and was heated at 200° C. for about 20 minutes, thereby forming a conductive buffer layer. Next, 5 mg of Polymer 1 prepared according to Synthesis Example 2 was dissolved in 1 ml of toluene to obtain a polymer solution, and the polymer solution was filtered using a 0.2 μm filter before spin coating. A resultant obtained by the filtering was spin-coated on the conductive buffer layer, and then heated at 200° C. for 10 minutes, thereby forming a hole transporting layer (HTL). A thickness of the HTL may be adjusted to be about 300 Å by adjusting concentration and spin speed of the polymer solution. 97 wt % of DSA as a host and 3 wt % of TBPe as a dopant were vacuum-deposited on the HTL to form an EML with a thickness of 300 Å. Next, Alq$_3$ was vacuum-deposited on the EML to form an ETL having a thickness of 200 Å. LiF having a thickness of 80 Å and Al having a thickness of 3000 Å were sequentially vacuum-deposited on the ETL to form an EIL and a cathode to manufacture an OLED. The thickness of layers and the growth speed thereof during the deposition were adjusted by using a crystal sensor.

Example 2

An OLED was manufactured in the same manner as Example 1 except that Polymer 2 of Synthesis Example 3 was used instead of Polymer 1 to form an HTL of Example 1.

Example 3

An OLED was manufactured in the same manner as Example 1 except that polymer 3 of Synthesis Example 4 was used instead of Polymer 1 to form an HTL of Example 1.

Comparative Example 1

An OLED was manufactured in the same manner as Example 1 except that an EML was formed on the conductive buffer layer without forming the HTL in Example 1.

Comparative Example 2

An OLED was manufactured in the same manner as Example 1 except that Polymer A below was used instead of Polymer 1 to form an HTL in Example 1. Polymer A (formula below) was analyzed by GPC. As a result, the Mw of Polymer A was 58,000 and the dispersion degree of Polymer A was 2.7.

<Polymer A>

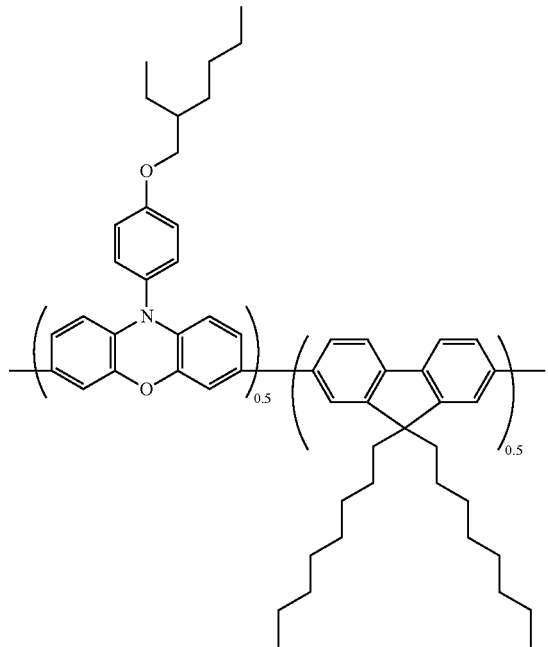

Evaluation Example

Luminance (cd/m$^2$), efficiency (cd/A), and lifetime of the OLEDs of Example 1, Example 2, Example 3, Comparative Example 1, and Comparative Example 2 were measured by using a PR650 (Spectroscan) Source Measurement Unit and results thereof are shown in Table 1. The lifetime was evaluated by measuring the time when the initial luminance of 100 cd/m$^2$ is reduced by half.

TABLE 1

| | HTL | Efficiency (cd/A) | Half lifetime (time)@ 100 cd/m$^2$ |
|---|---|---|---|
| Example 1 | Polymer 1 | 4.39 | 2000 |
| Example 2 | Polymer 2 | 4.76 | 2400 |
| Example 3 | Polymer 3 | 3.9 | 2200 |
| Comparative Example 1 | HTL is not formed | 1.32 | 13 |
| Comparative Example 2 | Polymer A | 3.16 | 1800 |

As shown in Table 1, the OLEDs of Examples 1 through 3 have better efficiency and lifetime characteristics than the OLED of Comparative Examples 1 and 2.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A polymer comprising Formula 1 below:

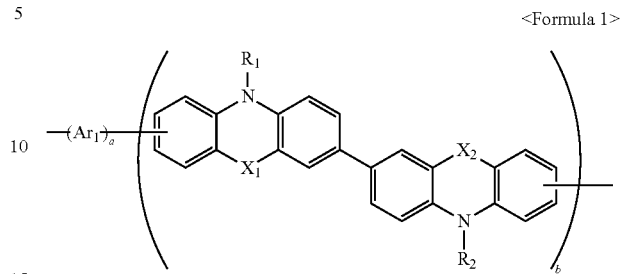

<Formula 1> wherein in Formula 1, $Ar_1$ is each independently represented by -$(Q_1)_n$-, wherein $Q_1$ is selected from the group consisting of a substituted or unsubstituted $C_5$-$C_{30}$ arylene group, a substituted or unsubstituted $C_4$-$C_{30}$ heteroarylene group, a substituted or unsubstituted $C_2$-$C_{30}$ alkenylene group, and a group represented by —N($Z_1$)—, wherein n is an integer from 1 to 10, and n groups of $Q_1$ in -$(Q_1)_n$- are identical to or different from each other, and wherein $X_1$ and $X_2$ are each independently selected from the group consisting of —O—, —S—, —N($Z_2$)—, and —C($Z_3$)($Z_4$)—, and wherein $R_1$, $R_2$, $Z_1$, $Z_2$, $Z_3$, and $Z_4$ are each independently selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group, and wherein a and b are independently a number from 0.01 to 0.99, wherein a+b=1.

2. The polymer of claim 1, wherein $Q_1$ is selected from the group consisting of a substituted or unsubstituted $C_5$-$C_{14}$ arylene group, a substituted or unsubstituted $C_4$-$C_{14}$ heteroarylene group, a substituted or unsubstituted $C_2$-$C_{10}$ alkenylene group, and a group represented by —N($Z_1$)—;

wherein $Z_1$ is selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group.

3. The polymer of claim 1, wherein $Q_1$ is selected from the group consisting of a $C_2$-$C_{10}$ alkenylene group and Formulae 2a through 2x below:

Formula 2a

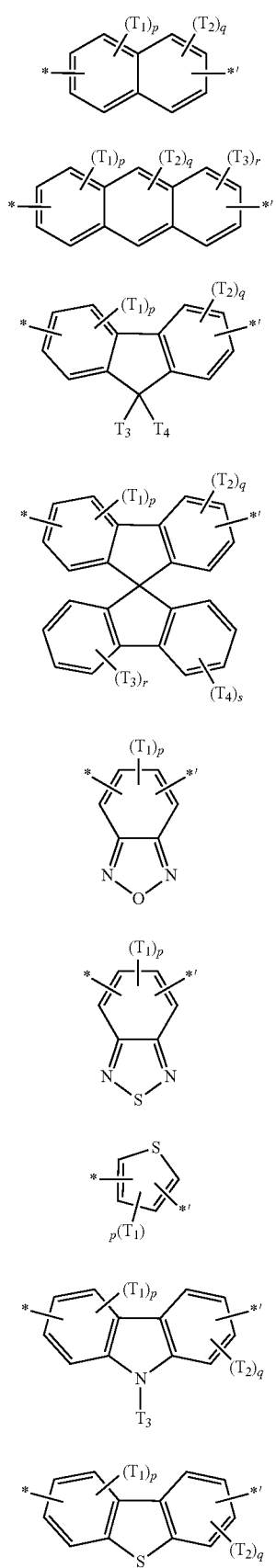
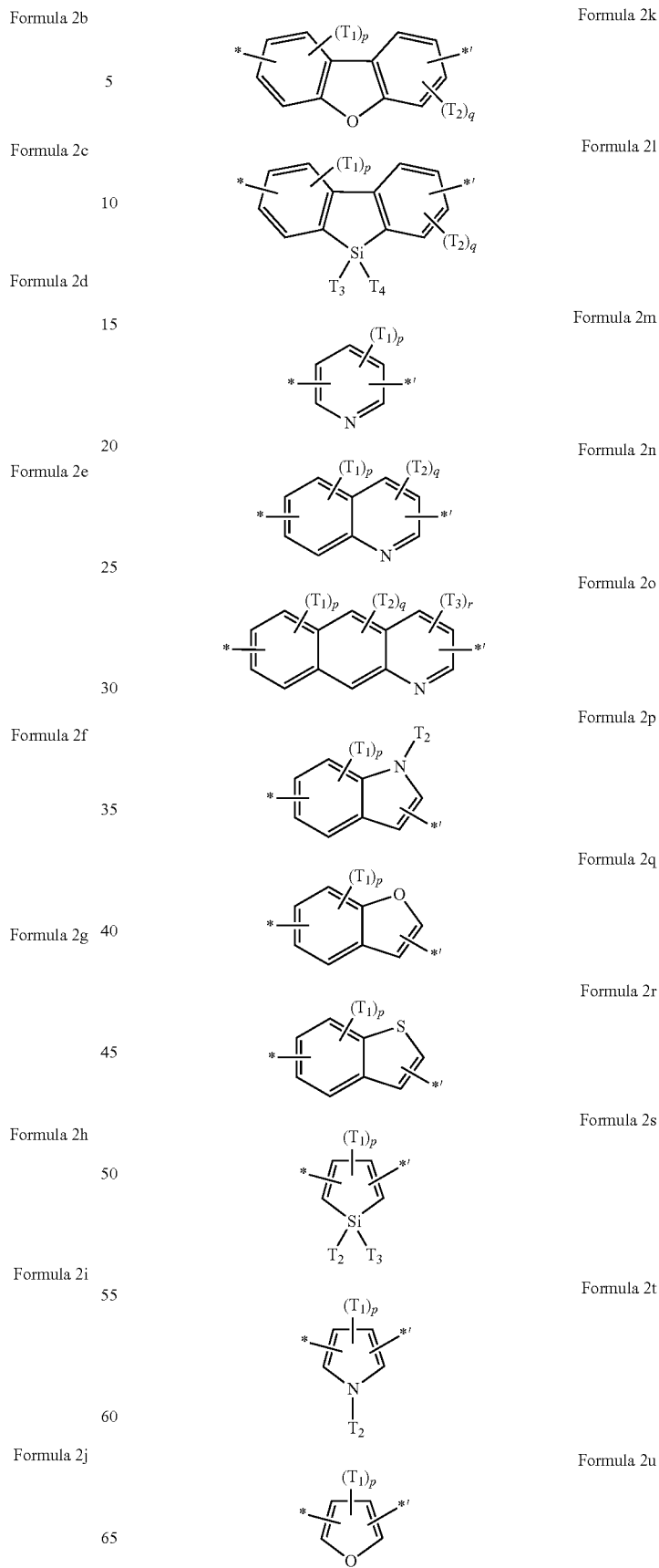

-continued

Formula 2v
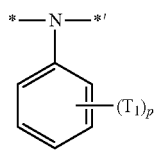

Formula 2w
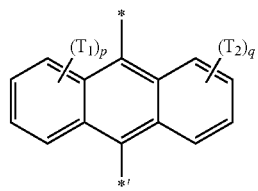

Formula 2x
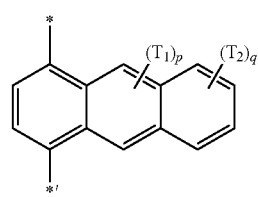

wherein in Formulae 2a through 2x, $T_1$ through $T_4$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, a $C_4$-$C_{14}$ heteroaryl group, and a group represented by —N($Z_5$)($Z_6$);

p, q, r, and s are each independently an integer from 0 through 4;

$Z_5$ and $Z_6$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, and a $C_4$-$C_{14}$ heteroaryl group; and p groups of $T_1$ in -($T_1$)$_p$ are identical to or different from each other, q groups of $T_2$ in -($T_2$)$_q$ are identical to or different from each other, r groups of $T_3$ in -($T_3$)$_r$ are identical to or different from each other, and s groups of $T_4$ in -($T_4$)$_s$ are identical to or different from each other.

4. The polymer of claim 3, wherein $T_1$ through $T_4$ are each independently selected from the group consisting of hydrogen, a $C_1$-$C_{10}$ alkyl group, a $C_1$-$C_{10}$ alkoxy group, a phenyl group, a naphthyl group, and a group represented by —N($Z_5$)($Z_6$), and $Z_5$ and $Z_6$ are each independently selected from the group consisting of hydrogen, a $C_1$-$C_{10}$ alkyl group, a $C_1$-$C_{10}$ alkoxy group, a phenyl group, and a naphthyl group.

5. The polymer of claim 1, wherein n is 1, 2, 3, 4, 5, or 6.

6. The polymer of claim 1, wherein $Ar_1$ is each independently selected from the group consisting of Formulae 2a through 2x and Formulae 3a through 3l below:

Formula 2a
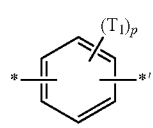

Formula 2b
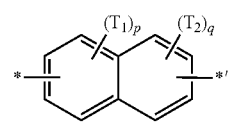

Formula 2c
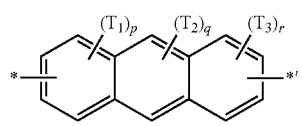

Formula 2d
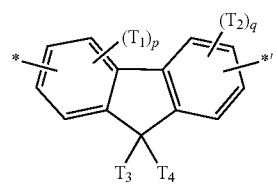

Formula 2e
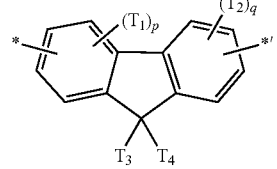

Formula 2e
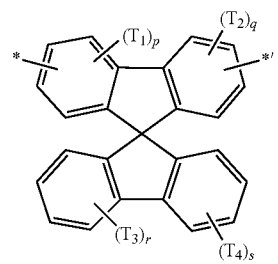

Formula 2f
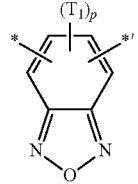

Formula 2g
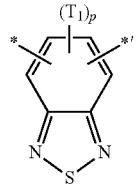

Formula 2h
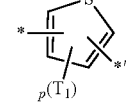

Formula 2i
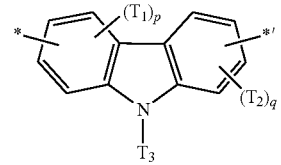

Formula 2j
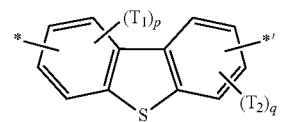

-continued
Formula 2k
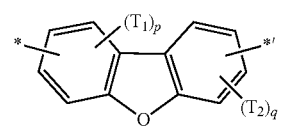
Formula 2l
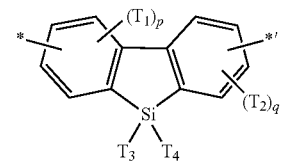
Formula 2m
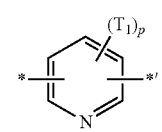
Formula 2n
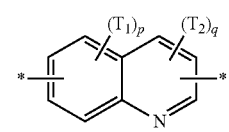
Formula 2o
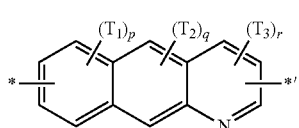
Formula 2p
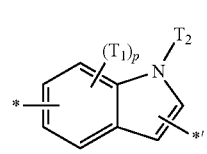
Formula 2q
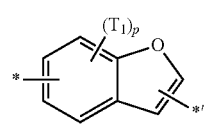
Formula 2r
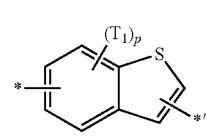
Formula 2s
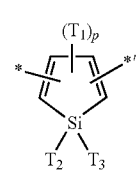
Formula 2t
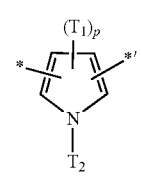
Formula 2u
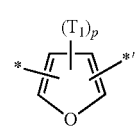
-continued
Formula 2v
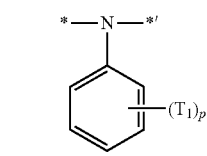
Formula 2w
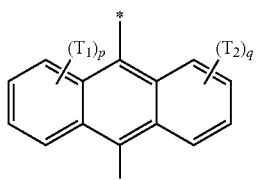
Formula 2x
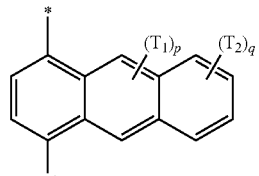
Formula 3a
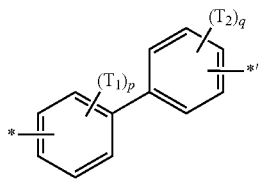
Formula 3b
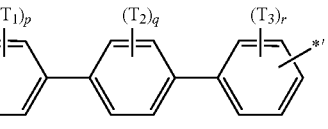
Formula 3c
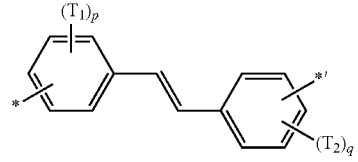
Formula 3d
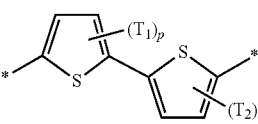
Formula 3e
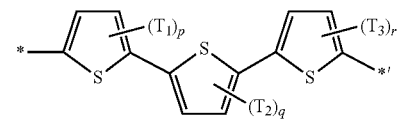
Formula 3f
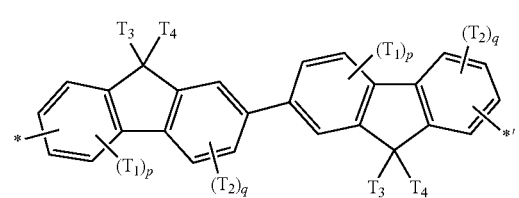

-continued

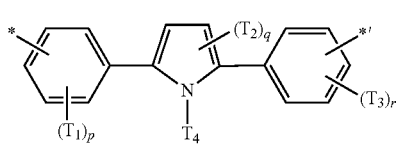
Formula 3g

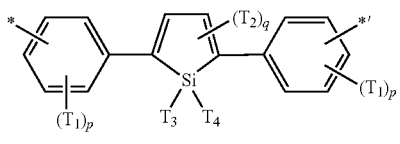
Formula 3h

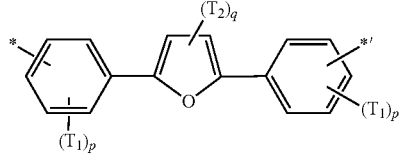
Formula 3i

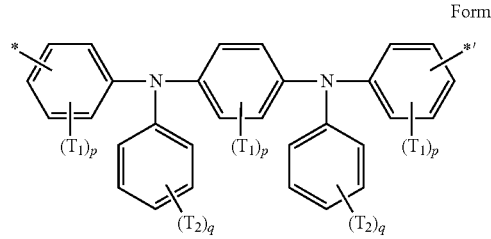
Formula 3j

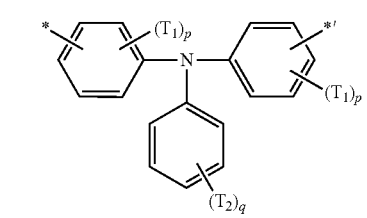
Formula 3k

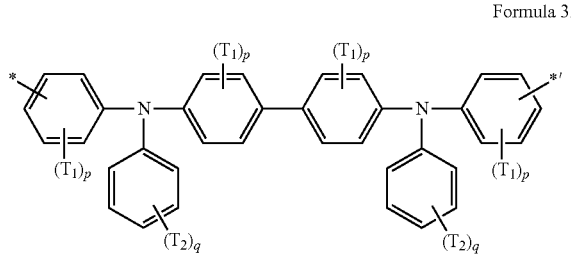
Formula 3l wherein in Formulae 2a through 2x and Formulae 3a through 3l, $T_1$ through $T_4$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, a $C_4$-$C_{14}$ heteroaryl group, and a group represented by —N($Z_5$)($Z_6$);

$Z_5$ and $Z_6$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, and a $C_4$-$C_{14}$ heteroaryl group;

p, q, r, and s are each independently an integer from 0 to 4; and p groups of $T_1$ in -($T_1$)$_p$ are identical to or different from each other, q groups of $T_2$ in -($T_2$)$_q$ are identical to or different from each other, r groups of $T_3$ in -($T_3$)$_r$ are identical to or different from each other, and s groups of $T_4$ in -($T_4$)$_s$ are identical to or different from each other.

7. The polymer of claim 1, wherein $Ar_1$ is represented by Formula 2d, and $T_1$ and $T_2$ of Formula 2d are hydrogen, and $T_3$ and $T_4$ are each independently selected from the group consisting of hydrogen, a $C_1$-$C_{10}$ alkyl group, and a $C_1$-$C_{10}$ alkoxy group:

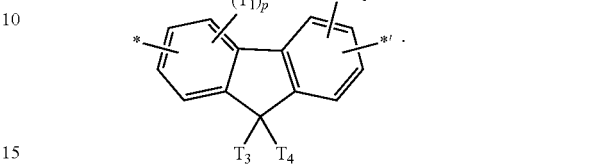
<Formula 2d>

8. The polymer of claim 1, wherein $Ar_1$ is represented by Formula 2e below, and $T_1$ and $T_2$ of Formula 2e are hydrogen, and $T_3$ and $T_4$ are each independently selected from the group consisting of hydrogen, a $C_1$-$C_{10}$ alkyl group, and a $C_1$-$C_{10}$ alkoxy group:

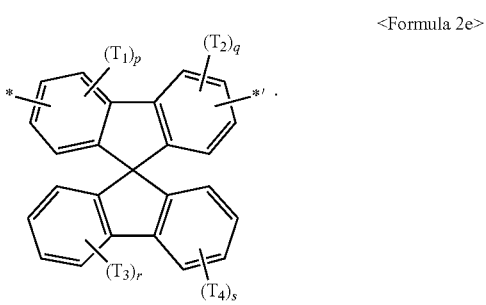
<Formula 2e>

9. The polymer of claim 1, wherein each of $X_1$ and $X_2$ are —O—.

10. The polymer of claim 1, wherein $R_1$ and $R_2$ are each independently selected from the group consisting of a $C_5$-$C_{14}$ aryl group; a $C_4$-$C_{14}$ heteroaryl group; a $C_5$-$C_{14}$ aryl group substituted with at least one selected from the group consisting of a halogen atom, a hydroxyl group, a cyano group, a $C_1$-$C_{10}$ alkyl group, a $C_1$-$C_{10}$ alkoxy group, and a $C_5$-$C_{14}$ aryl group; and a $C_4$-$C_{14}$ heteroaryl group substituted with at least one selected from the group consisting of a halogen atom, a hydroxyl group, a cyano group, a $C_1$-$C_{10}$ alkyl group, a $C_1$-$C_{10}$ alkoxy group, and a $C_5$-$C_{14}$ aryl group.

11. The polymer of claim 1, wherein $R_1$ and $R_2$ are each represented by Formula 4a below:

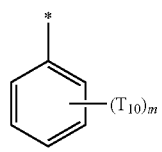
<Formula 4a> wherein $T_{10}$ in Formula 4a is selected from the group consisting of hydrogen, a halogen atom, a hydroxyl group, a cyano group, a $C_1$-$C_{10}$ alkyl group, a $C_1$-$C_{10}$ alkoxy group, a $C_5$-$C_{14}$ aryl group, and a $C_4$-$C_{14}$ heteroaryl group, and m groups of $T_{10}$ of -($T_{10}$)$_m$ are identical to or different from each other, and m is an integer from 0 to 4.

12. The polymer of claim 1, wherein a and b are each independently a number from 0.3 to 0.7.
13. The polymer of claim 1, wherein the polymer is represented by Formula 6 or Formula 7 below:
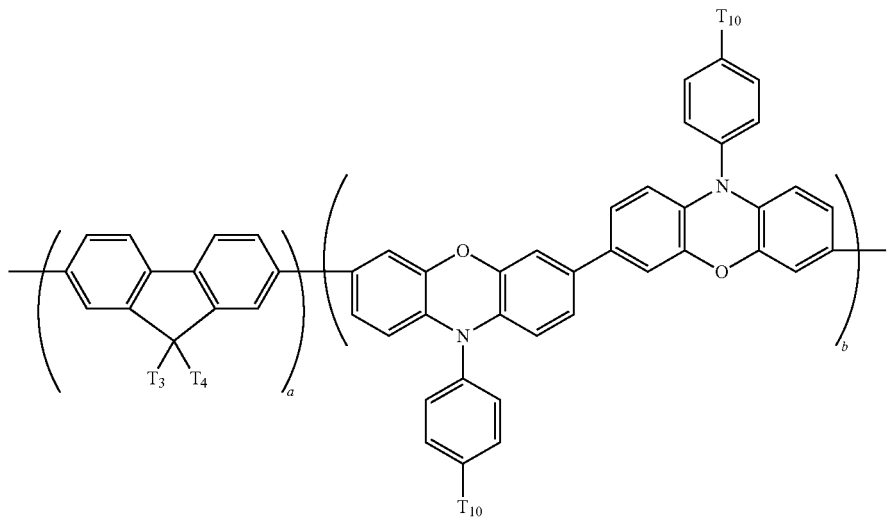
<Formula 6>
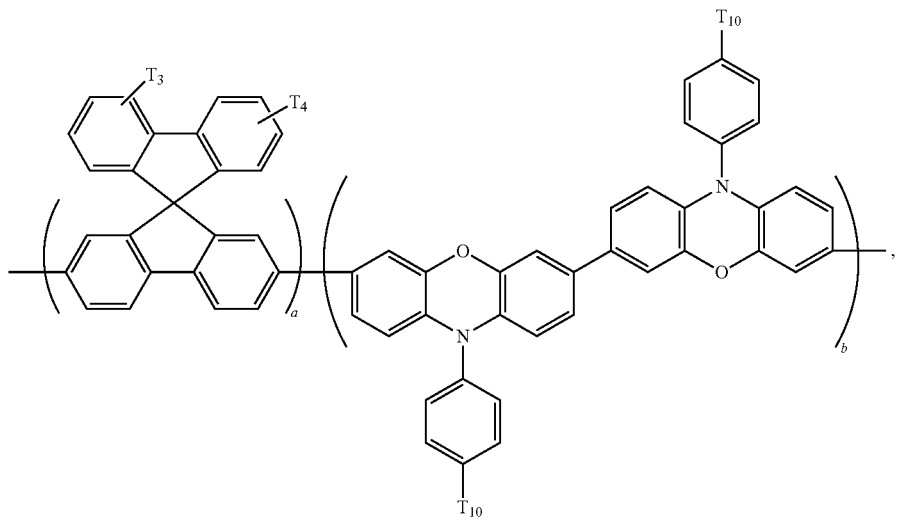
<Formula 7> wherein in Formulae 6 and 7, $T_{10}$, $T_3$, and $T_4$ are each independently selected from the group consisting of hydrogen, a $C_1$-$C_{10}$ alkyl group, and a $C_1$-$C_{10}$ alkoxy group, and a and b are each independently a number in a range of 0.01 to 0.99, and a+b=1.

14. The polymer of claim 1, wherein the polymer has an average weight molecular weight (Mw) of from about 10,000 through about 200,000.

15. The polymer of claim 1, wherein the polymer has polydispersion index (PDI) of from about 1.5 through about 5.

16. An organic light emitting device (OLED) comprising: a substrate; a first electrode; a second electrode; and a first layer comprising the polymer of claim 1 and disposed between the first and second electrodes.

17. The organic light emitting device (OLED) of claim 16, wherein the first layer is a hole transporting layer.

18. The organic light emitting device (OLED) of claim 16, further comprising at least one layer selected from the group consisting of a conductive buffer layer, a hole injection layer, a hole transporting layer, an emissive layer, a hole blocking layer, an electron transporting layer, and an electron injection layer, and disposed between the first and second electrodes.

19. An organic light emitting device (OLED) comprising: a substrate; a first electrode; a second electrode; and a first layer comprising a polymer disposed between the first and second electrodes;

wherein the polymer is represented by Formula 6 or Formula 7 below:

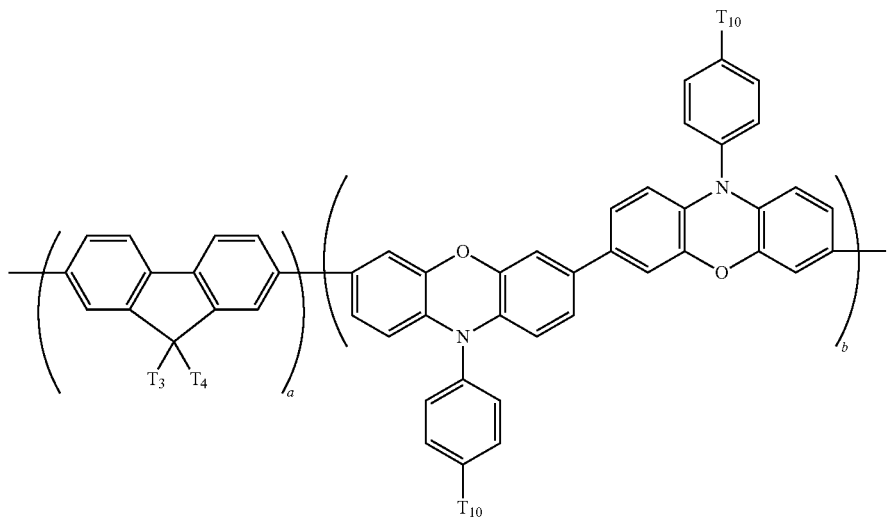

<Formula 6>

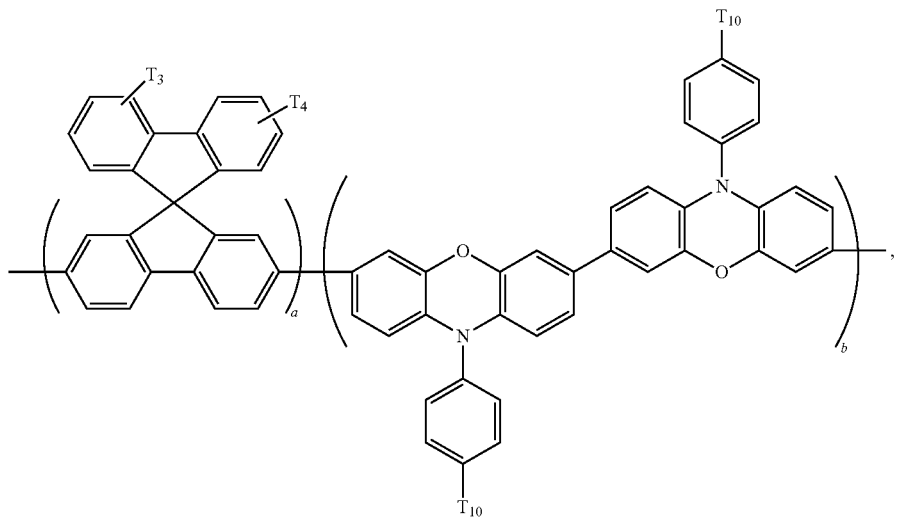

<Formula 7> wherein in Formulae 6 and 7, $T_{10}$, $T_3$, and $T_4$ are each independently selected from the group consisting of hydrogen, a $C_1$-$C_{10}$ alkyl group, and a $C_1$-$C_{10}$ alkoxy group, and a and b are each independently a number in a range of 0.01 to 0.99, and a+b=1.

20. The organic light emitting device (OLED) of claim 19, wherein the polymer has an average weight molecular weight (Mw) of from about 10,000 through about 200,000.

21. A polymer comprising Formula 1 below:

<Formula 1>

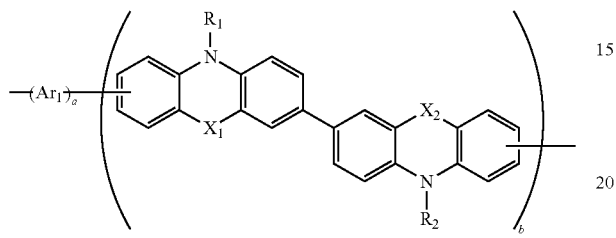

wherein in Formula 1, $Ar_1$ is each independently represented by $-(Q_1)_n-$, wherein $Q_1$ is selected from the group consisting of a $C_2$-$C_{10}$ alkenylene group, Formula 2e, Formula 2i, Formula 2j, Formula 2k, Formula 2l and Formula 2n through 2v below, wherein n is an integer from 1 to 10, and n groups of $Q_1$ in $-(Q_1)_n-$ are identical to or different from each other, and wherein $X_1$ and $X_2$ are each independently selected from the group consisting of —O—, —S—, —N($Z_2$)—, and —C($Z_3$)($Z_4$)—, and wherein $R_1$, $R_2$, $Z_2$, $Z_3$, and $Z_4$ are each independently selected from the group consisting of hydrogen, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{12}$ cycloalkyl group, a substituted or unsubstituted $C_3$-$C_{12}$ cycloheteroalkyl group, a substituted or unsubstituted $C_5$-$C_{30}$ aryl group, and a substituted or unsubstituted $C_4$-$C_{30}$ heteroaryl group, and wherein a and b are independently a number from 0.01 to 0.99, wherein a+b=1:

Formula 2e

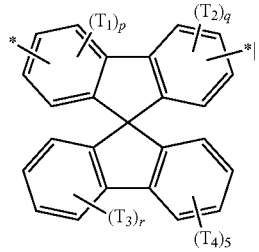

Formula 2i

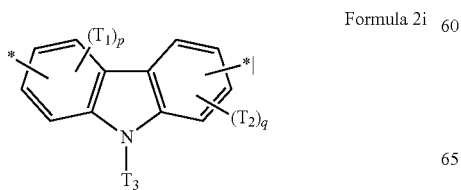

Formula 2j

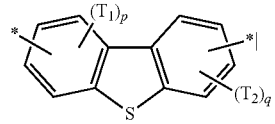

Formula 2k

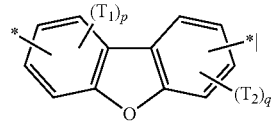

Formula 2l

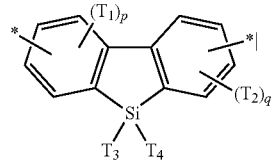

Formula 2n

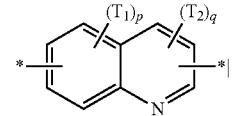

Formula 2o

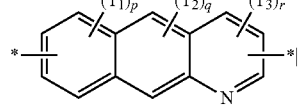

Formula 2p

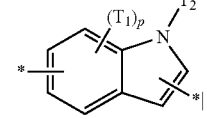

Formula 2q

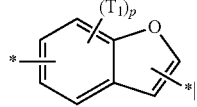

Formula 2r

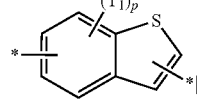

Formula 2s

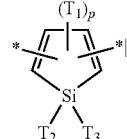

Formula 2t

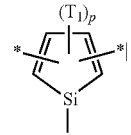

Formula 2u

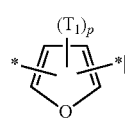

-continued

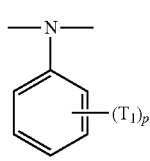

Formula 2v wherein in Formulae 2e, 2i, 2j, 2k, 2l and 2n through 2v, $T_1$ through $T_4$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, a $C_4$-$C_{14}$ heteroaryl group, and a group represented by —$N(Z_5)(Z_6)$;

p, q, r, and s are each independently an integer from 0 through 4, provided that r and s in Formula 2e are 0;

$Z_5$ and $Z_6$ are each independently selected from the group consisting of hydrogen, a halogen atom, a cyano group, a hydroxyl group, a $C_1$-$C_{10}$ alkyl group, a $C_1$-$C_{10}$ alkoxy group, a $C_2$-$C_{10}$ alkenyl group, a $C_5$-$C_{14}$ aryl group, and a $C_4$-$C_{14}$ heteroaryl group; and p groups of $T_1$ in -$(T_1)_p$ are identical to or different from each other, q groups of $T_2$ in -$(T_2)_q$ are identical to or different from each other, r groups of $T_3$ in -$(T_3)$, are identical to or different from each other, and s groups of $T_4$ in -$(T_4)$, are identical to or different from each other.

* * * * *